US012649971B2

(12) United States Patent
Azumo et al.

(10) Patent No.: US 12,649,971 B2
(45) Date of Patent: Jun. 9, 2026

(54) FILM FORMING METHOD AND FILM FORMING DEVICE

(71) Applicant: Tokyo Electron Limited, Tokyo (JP)

(72) Inventors: Shuji Azumo, Yamanashi (JP); Sena Fujita, Yamanashi (JP); Tadashi Mitsunari, Yamanashi (JP); Yumiko Kawano, Yamanashi (JP); Shinichi Ike, Gyeonggi-do (KR)

(73) Assignee: TOKYO ELECTRON LIMITED, Tokyo (JP)

( * ) Notice: Subject to any disclaimer, the term of this patent is extended or adjusted under 35 U.S.C. 154(b) by 54 days.

(21) Appl. No.: 18/565,703

(22) PCT Filed: May 25, 2022

(86) PCT No.: PCT/JP2022/021412
§ 371 (c)(1),
(2) Date: Nov. 30, 2023

(87) PCT Pub. No.: WO2022/255191
PCT Pub. Date: Dec. 8, 2022

(65) Prior Publication Data
US 2024/0263306 A1 Aug. 8, 2024

(30) Foreign Application Priority Data
Jun. 2, 2021 (JP) ................................. 2021-093208

(51) Int. Cl.
C23C 16/455 (2006.01)
C23C 16/04 (2006.01)
C23C 16/458 (2006.01)
C23C 16/54 (2006.01)
C23C 16/56 (2006.01)

(52) U.S. Cl.
CPC ...... *C23C 16/45527* (2013.01); *C23C 16/045* (2013.01); *C23C 16/45563* (2013.01); *C23C 16/4583* (2013.01); *C23C 16/54* (2013.01); *C23C 16/56* (2013.01)

(58) Field of Classification Search
None
See application file for complete search history.

(56) References Cited

U.S. PATENT DOCUMENTS

2017/0140920 A1* 5/2017 Arnepalli .......... H01L 21/30621
2021/0020432 A1* 1/2021 Blanquart .............. C23C 16/26

FOREIGN PATENT DOCUMENTS

JP 2020-147829 A 9/2020

* cited by examiner

*Primary Examiner* — Shamim Ahmed
*Assistant Examiner* — Bradford M Gates
(74) *Attorney, Agent, or Firm* — Nath, Goldberg & Meyer; Jerald L. Meyer; Tanya E. Harkins

(57) ABSTRACT

A film forming method includes: (A) preparing a substrate with a surface having a first region where a first film is exposed, and a second region where a second film formed by a material different from the first film is exposed; (B) forming a stepped portion in the surface such that the first region becomes higher than the second region; (C) supplying a liquid to the surface where the stepped portion is formed; and (D) supplying, to the surface, a processing gas that chemically changes the liquid, and moving the liquid from the second region to the first region by a reaction between the processing gas and the liquid to selectively form a film in the first region with respect to the second region.

16 Claims, 16 Drawing Sheets

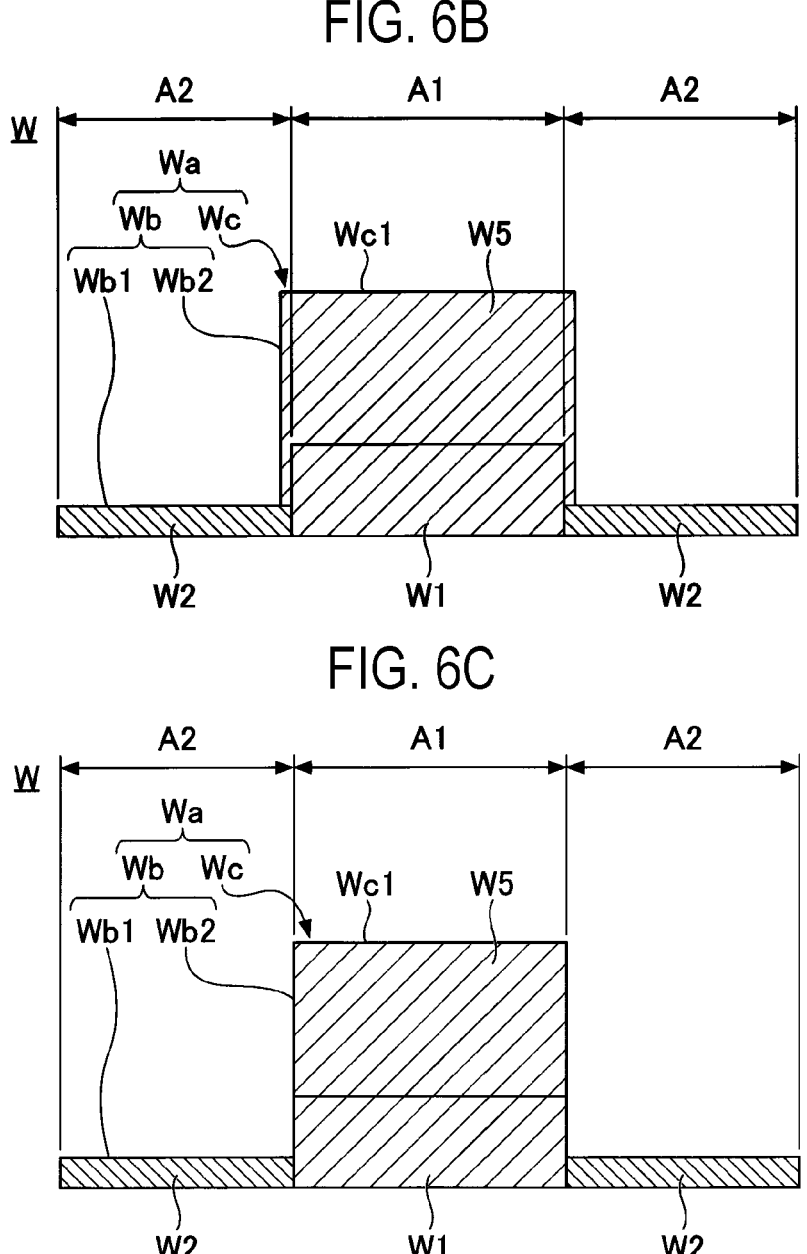

Time of step S9 [hour]

FILM FORMING METHOD AND FILM FORMING DEVICE

TECHNICAL FIELD

The present disclosure relates to a film forming method and a film forming device.

BACKGROUND

A film forming method disclosed in Patent Document 1 includes an operation of preparing a substrate having a first region where a first material is exposed and a second region where a second material different from the first material is exposed, an operation of selectively forming a desired target film in the first region out of the first region and the second region, and an operation of removing a product generated in the second region while forming the target film by supplying a $ClF_3$ gas to the substrate.

PRIOR ART DOCUMENT

Patent Document

Patent Document 1: Japanese Laid-Open Patent Publication No. 2020-147829

An aspect of the present disclosure provides a technique capable of selectively forming a film in a first region out of the first region where a first film is exposed and a second region where a second film formed of a material different from the first film is exposed.

SUMMARY

A film forming method of an aspect of the present disclosure includes (A) to (D) as follows: (A) preparing a substrate having, on a surface thereof, a first region where a first film is exposed, and a second region where a second film formed by a material different from the first film is exposed; (B) forming a stepped portion in the surface such that the first region becomes higher than the second region; (C) supplying a liquid to the surface where the stepped portion is formed; and (D) supplying a processing gas that chemically changes the liquid, to the surface, and moving the liquid from the second region to the first region by a reaction between the processing gas and the liquid to selectively form a film in the first region with respect to the second region.

According to an aspect of the present disclosure, it is possible to selectively form a film in a first region out of the first region where a first film is exposed and a second region where a second film formed of a material different from the first film is exposed.

BRIEF DESCRIPTION OF DRAWINGS

FIG. 6B is a cross-sectional view illustrating a modification immediately before step S7.

FIG. 6C is a cross-sectional view illustrating a modification immediately after step S7.

FIG. 8C is a SEM photograph of the substrate according to Example 1, taken after step S4.

FIG. 9A is a SEM photograph of a substrate according to Example 2, taken after step S3 and before step S4.

FIG. 9B is a SEM photograph of the substrate according to Example 2, taken after step S4.

DETAILED DESCRIPTION

Figure 1:
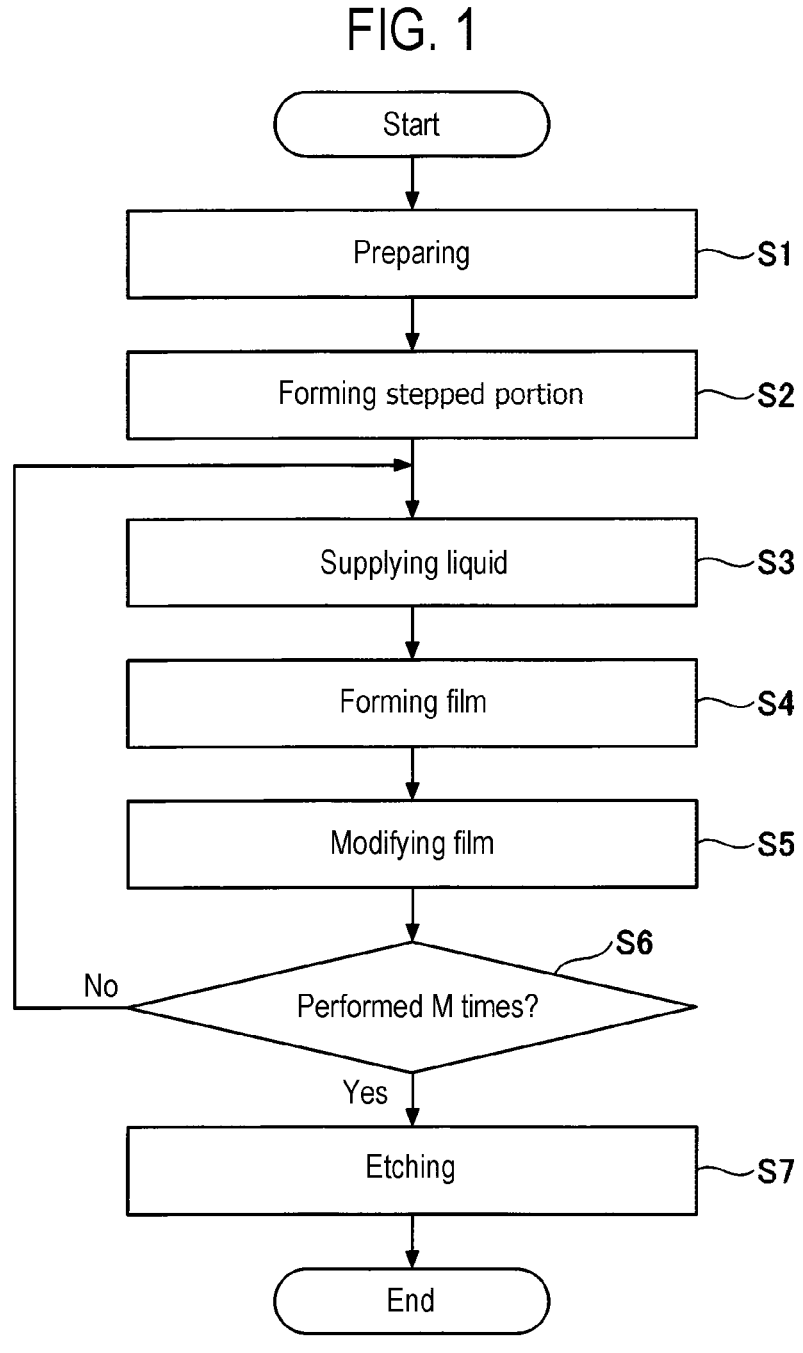
FIG. 1 is a flowchart illustrating a film forming method according to an embodiment.

Hereinafter, embodiments of the present disclosure will be described with reference to the drawings. In each drawing, the same or corresponding components may be denoted by the same reference numerals, and a description thereof may be omitted.

An example of a film forming method will be described with reference to FIG. 1 and the like. As illustrated in FIG. 1, the film forming method includes, for example, steps S1 to S7. The film forming method may include at least steps S1 to S4. In addition, the film forming method may further include steps other than steps S1 to S7.

Figures 2A, 2B, 2C:
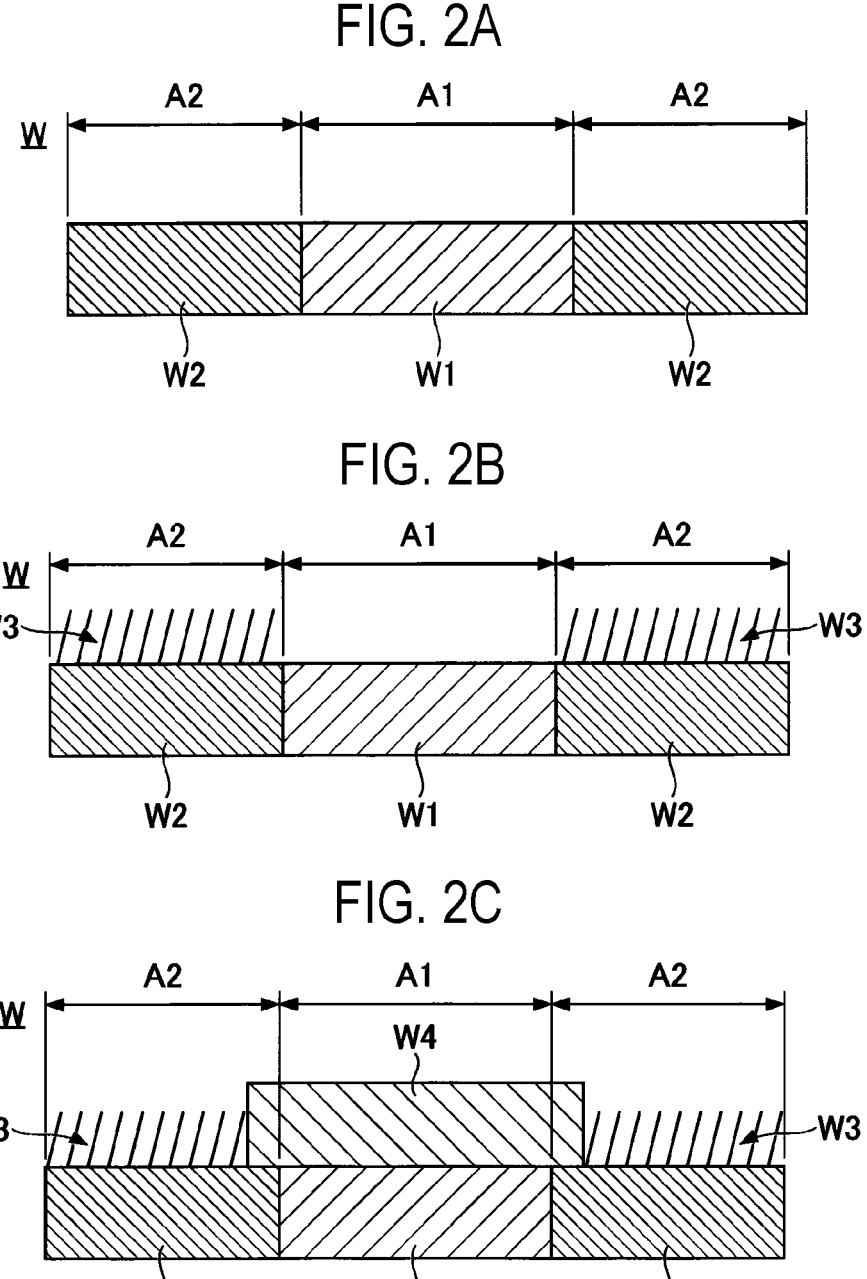
FIG. 2A is a cross-sectional view illustrating an example of step S1.
FIG. 2B is a cross-sectional view illustrating an example of a first process of step S2.
FIG. 2C is a cross-sectional view illustrating an example of a second process of step S2.

In step S1 of FIG. 1, a substrate W is prepared as illustrated in FIG. 2A. A surface of the substrate W prepared in step S1 has a first region A1 where a first film W1 is exposed and a second region A2 where a second film W2 formed of a material different from the first film W1 is exposed. The first region A1 and the second region A2 are provided on one side of the substrate W in a thickness direction. The first region A1 and the second region A2 do not need to have a stepped portion at a boundary therebetween, and may be flush with each other.

The substrate W includes, for example, a silicon wafer (not illustrated), and the first film W1 and the second film W2 are formed on the silicon wafer. The substrate W may include a compound semiconductor wafer or a glass substrate instead of the silicon wafer. The compound semiconductor wafer is not particularly limited, but may be, for example, a GaAs wafer, a SiC wafer, a GaN wafer, or an InP wafer.

The first film W1 is, for example, an insulating film. The insulating film is, for example, a SiO film, a SiN film, a SiCO film, a SiCN film, a SiON film, or a SiC film. Here, the SiO film means a film containing silicon (Si) and oxygen (O). An atomic ratio of Si and O in the SiO film is not limited to 1:1. This holds true in the SiO film, SiN film, SiCO film, SiCN film, SiON film, or SiC film.

On the other hand, the second film W2 is, for example, a conductive film. The conductive film is a metal film or a metal nitride film. The metal film is, for example, a Cu film, a Ru film, a Co film, a W film, or a Ti film. The metal nitride film is, for example, a TiN film or a TaN film. Here, the TiN film means a film containing titanium (Ti) and nitrogen (N). An atomic ratio of Ti and N in the TiN film is not limited to 1:1. This holds true in the TaN film.

In the present embodiment, the first film W1 is an insulating film and the second film W2 is a conductive film, but the insulating film and the conductive film may be reversed so that the first film W1 may be a conductive film and the second film W2 may be an insulating film. In addition, the number of first region A1 is one in FIG. 2A, but may be two or more. For example, two first regions A1 may be arranged with a second region A2 interposed therebetween. The first region A1 and the second region A2 are adjacent in FIG. 2A but may be spaced apart from each other.

The surface of the substrate W may have a third region (not illustrated) in addition to the first region A1 and the second region A2. The third region is a region where a third film made of a material different from the first film W1 and the second film W2 is exposed. The third region may be arranged between the first region A1 and the second region A2, or may be arranged outside the first region A1 and the second region A2.

For example, the surface of the substrate W may further have a third region where a barrier film (not illustrated) is exposed. In this case, the third region is formed between the first region A1 and the second region A2. The barrier film is formed along a concave portion of the insulating film to suppress diffusion of metal from the metal film embedded in the concave portion of the insulating film to the insulating film. The barrier film is not particularly limited, but is, for example, a TaN film or a TiN film.

In addition, the surface of the substrate W may further have a fourth region where a liner film (not illustrated) is exposed. In this case, the fourth region is formed between the second region A2 and the third region. The liner film is formed over the barrier film and assists in the formation of a metal film. The metal film is formed on the liner film. The liner film is not particularly limited, but is, for example, a Co film or a Ru film.

Figures 2D, 3A:
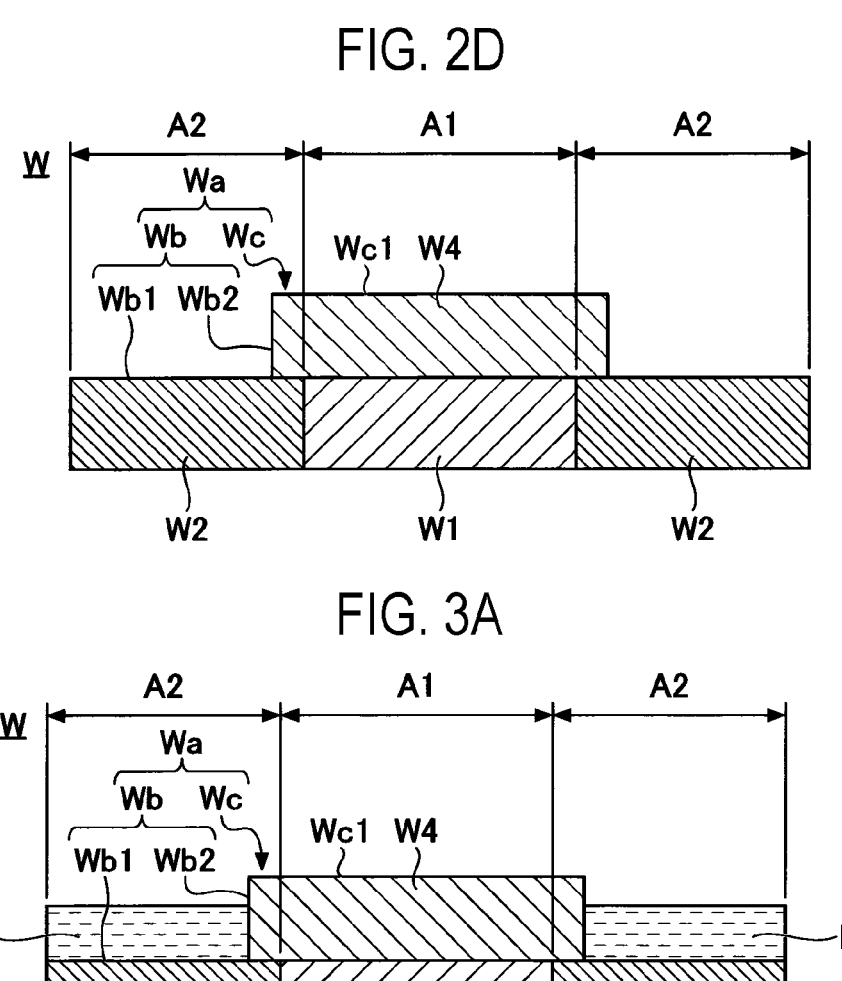
FIG. 2D is a cross-sectional view illustrating an example of a third process of step S2.
FIG. 3A is a cross-sectional view illustrating an example of step S3.

In step S2 of FIG. 1, a stepped portion is formed in the surface of the substrate W so that the first region A1 is higher than the second region A2, as shown in FIGS. 2B to 2D. For example, first, as illustrated in FIG. 2B, an organic compound is supplied to the surface of the substrate W, and a self-assembled monomolecular film (SAM) is selectively applied to the second region A2 with respect to the first region A1. The organic compound is supplied in a gaseous state in the present embodiment, but may be supplied in a liquid state.

The organic compound, which is the raw material for the self-assembled monomolecular film W3, is appropriately selected depending on the materials of the first film W1 and the second film W2. When the first film W1 is an insulating film and the second film W2 is a conductive film, the organic compound is, for example, a thiol compound. The thiol compound is, for example, a compound represented by a general formula R—SH. Thiol groups (SH) are more easily chemically adsorbed onto a conductive film than onto an insulating film.

Here, R is an aliphatic hydrocarbon group or an aromatic hydrocarbon group, and some of hydrogen atoms may be replaced with halogen atoms. The halogen atoms include fluorine, chlorine, bromine, iodine, and the like. The thiol compound is, for example, $CF_3(CF_2)_X(CH_2)_2SH$ (X is an integer of 0 to 17) or $CH_3(CH_2)_XSH$ (X is an integer of 1 to 19).

In addition, as illustrated in FIG. 2C, step S2 includes forming a second insulating film W4 in the first region A1 while inhibiting formation of the second insulating film W4 in the second region A2 by using the self-assembled monomolecular film W3. The second insulating film W4 is formed by, for example, a chemical vapor deposition (CVD) method or an atomic layer deposition (ALD) method.

The second insulating film W4 is, for example, a SiO film, an AlO film, a SiN film, a ZrO film, or an HfO film. Here, the AlO film means a film containing aluminum (Al) and oxygen (O). An atomic ratio of Al and O in the AlO film is not limited to 1:1. This holds true in the SiO film, SiN film, ZrO film, and HfO film. The second insulating film W4 may be made of the same material as the first insulating film W1, or may be made of a different material.

When the AlO film is formed by the ALD method, an Al-containing gas such as a trimethylaluminum (TMA) gas and an oxidizing gas such as water vapor ($H_2O$ gas) are alternately supplied to the surface of the substrate W. Since water vapor is not adsorbed onto a hydrophobic self-assembled monomolecular film W3, AlO is selectively deposited in the first region A1. In addition to the Al-containing gas and the oxidizing gas, a modifying gas such as a hydrogen gas may be supplied to the substrate 1. These raw material gases may be plasmarized to promote a chemical reaction. In addition, these raw material gases may be heated to promote the chemical reaction.

When the HfO film is formed by the ALD method, an Hf-containing gas such as a tetrakis(dimethylamide)hafnium (TDMAH: Hf[N(CH$_3$)$_2$]$_4$) gas and an oxidizing gas such as water vapor (H$_2$O gas) are alternately supplied to the surface of the substrate W. Since water vapor is not adsorbed onto a hydrophobic self-assembled monomolecular film W3, HfO is selectively deposited in the first region A1. In addition to the Hf-containing gas and the oxidizing gas, a modifying gas such as a hydrogen gas may be supplied to the substrate W. These raw material gases may be plasmarized to promote a chemical reaction. In addition, these raw material gases may be heated to promote the chemical reaction.

In addition, step S2 includes removing the self-assembled monomolecular film W3, as illustrated in FIG. 2D. The removing method may be a general method and, for example, a method of ashing the self-assembled monomolecular film with ozone or the like is used. Alternatively, the self-assembled monomolecular film may be removed with plasma hydrogen, plasma oxygen, or plasma ammonia.

As illustrated in FIG. 2C, when the formation of the second insulating film W4 in the second region A2 is inhibited by using the self-assembled monomolecular film W3 and the second insulating film W4 is formed in the first region A1, the second insulating film W4 may protrude laterally from the first region A1, as illustrated in FIG. 2D. As the second insulating film W4 becomes thicker, the second insulating film W4 is likely to protrude laterally. When the second insulating film W4 is etched, a portion of the second insulating film W4 that protrudes laterally from the first region A1 may be removed, but the thickness of the second insulating film W4 becomes thinner.

Therefore, in the film forming method of the present embodiment, the stepped portion formed in step S2 is expanded as described later. A substrate surface Wa before the stepped portion is expanded includes a concave portion Wb and a convex portion Wc, which are adjacent to each other, as illustrated in FIG. 2D. The concave portion Wb is a trench, a hole, or the like. The hole includes a via hole. The convex portion We may be a pillar, a fin, or the like.

The substrate surface Wa includes, for example, a bottom surface Wb1 of the concave portion, side surfaces Wb2 of the concave portion, and a top surface Wc1 of the convex portion. For example, the top surface Wc1 of the convex portion is a flat surface, and the concave portion Wb is recessed from the top surface Wc1 of the convex portion. A depth of the concave portion Wb represents a size of the stepped portion. The bottom surface Wb1 of the concave portion is formed of a conductive film which is the second film W2. On the other hand, the side surfaces Wb2 of the concave portion and the top surface Wc1 of the convex portion are formed by a second insulating film W4.

In step S3 of FIG. 1, a liquid L is supplied to the substrate surface Wa, as illustrated in FIG. 3A. In FIG. 3A, the liquid L is filled only in the concave portion Wb and does not cover the top surface Wc1 of the convex portion, but may overflow from the concave portion Wb and may cover the top surface Wc1 of the convex portion.

The liquid L preferably has strong intermolecular force. As the intermolecular force of the liquid L increases, a cohesive force thereof is increased. When the cohesive force of the liquid L is large, evaporation of the liquid L may be prevented. The intermolecular force of the liquid L is, for example, 30 kJ/mol or more.

The liquid L is, for example, a halide. A liquid halide is formed, for example, by a reaction between a raw material gas of the halide and a reaction gas that reacts with the raw material gas. The production of the liquid L may be promoted by plasmarizing both the raw material gas and the reaction gas, or the reaction gas. The raw material gas is, for example, a TiCl$_4$ gas, and the reaction gas is, for example, a H$_2$ gas.

The TiCl$_4$ gas and the H$_2$ gas are generally used not for forming the liquid L, but for forming a Ti film. The Ti film is formed by, for example, a chemical vapor deposition (CVD) method or an atomic layer deposition (ALD) method. In the CVD method, the TiCl$_4$ gas and the H$_2$ gas are simultaneously supplied to the substrate W. On the other hand, in the ALD method, the TiCl$_4$ gas and the H$_2$ gas are alternately supplied to the substrate W. According to the CVD method or the ALD method, it is estimated that Equations (1) to (3) below contribute to the formation of the Ti film.

$$TiCl_4 + H_2 \rightarrow TiH_xCl_y \tag{1}$$

$$TiH_xCl_y \rightarrow TiCl_2 + HCl \tag{2}$$

$$TiCl_2 + H_2 \rightarrow Ti + HCl \tag{3}$$

In Equations (2) and (3) above, TiCl$_2$ may be TiCl or TiCl$_3$.

In forming the Ti film, a temperature of the substrate W is controlled to 400 degrees C. or higher. As a result, the reactions of Equations (1) to (3) above proceed in sequence to form the Ti film.

On the other hand, in forming the liquid L, the temperature of the substrate W is controlled to −100 degrees C. to 390 degrees C., preferably 20 degrees C. to 350 degrees C. As a result, the reaction of Equation (2) above and the reaction of Equation (3) above are suppressed, so that a liquid L containing TiH$_x$Cl$_y$ is formed. The liquid L may contain Ti, TiCl, TiCl$_2$, TiCl$_3$, or TiCl$_4$. The temperature of the substrate W only needs to be lower than a decomposition point of the liquid L.

The raw material gas is not limited to the TiCl$_4$ gas. For example, the raw material gas may be a halogenated silicon gas such as a SiCl$_4$ gas, a Si$_2$Cl$_6$ gas, or a SiHCl$_3$ gas, or a metal halide gas such as a WCl$_4$ gas, a VCl$_4$ gas, an AlCl$_3$ gas, a MoCl$_5$ gas, a SnCl$_4$ gas, or a GeCl$_4$ gas. The raw material gas only needs to contain halogen, and the halogen may include bromine (Br), iodine (I), fluorine (F), or the like instead of chlorine (Cl). When the temperature of the substrate W is low, a reaction similar to Equation (1) above will mainly proceed with these raw material gases, so that a halide liquid L is formed.

In addition, the reaction gas is not limited to the H$_2$ gas. The reaction gas only needs to be a gas that is capable of forming the liquid L by reaction with the raw material gas. For example, the reaction gas may be a D$_2$ gas. The reaction gas may be supplied together with an inert gas such as an argon gas.

Step S3 includes, for example, supplying a material gas and a reaction gas to the substrate W at the same time. In this case, step S3 may further include plasmarizing both the raw material gas and the reaction gas. By the plasmarization, the reaction between the raw material gas and the reaction gas can be promoted. In addition, the plasmarization makes it easier to form the liquid L at a low substrate temperature.

In addition, step S3 includes supplying the raw material gas and the reaction gas to the substrate W at the same time in the present embodiment, but may also include supplying the raw material gas and the reaction gas to the substrate W alternately. In the latter case, step S3 may further include plasmarizing the reaction gas. By the plasmarization, the reaction between the raw material gas and the reaction gas can be promoted. In addition, the plasmarization makes it easier to form the liquid L at a low substrate temperature. Further, step S3 may include supplying only the raw material gas to the substrate W.

The liquid L only needs to have a strong intermolecular force and may be an ionic liquid, a liquid metal, a liquid polymer, or the like. The metal may be a pure metal or an alloy. The polymer may be, for example, an oligomer or polymer formed by polymerizing two or more molecules of a $Si_2Cl_6$ gas, a $SiCl_4$ gas, a $SiHCl_3$ gas, a $SiH_2Cl_2$ gas, a $SiH_3Cl$ gas, a $SiH_4$ gas, a $Si_2H_6$ gas, a $Si_3H_8$ gas, a $Si_4H_{10}$ gas, a cyclohexasilane gas, a tetraethoxysilane (TEOS) gas, a dimethyldiethoxysilane (DMDEOS) gas, a 2,4,6,8-tetramethylcyclotetrasiloxane (TMCTS) gas, a trisilylamine (TSA) gas, or the like, or may be, for example, polysiloxane, polysilane, or polysilazane. In addition, the liquid L may be silanol or the like. These liquids L are supplied to the concave portion Wb of the substrate W by a spin coating method, or are synthesized inside a processing container that accommodates the substrate W, and are then supplied to the concave portion Wb of the substrate W.

Figures 3B, 3C:
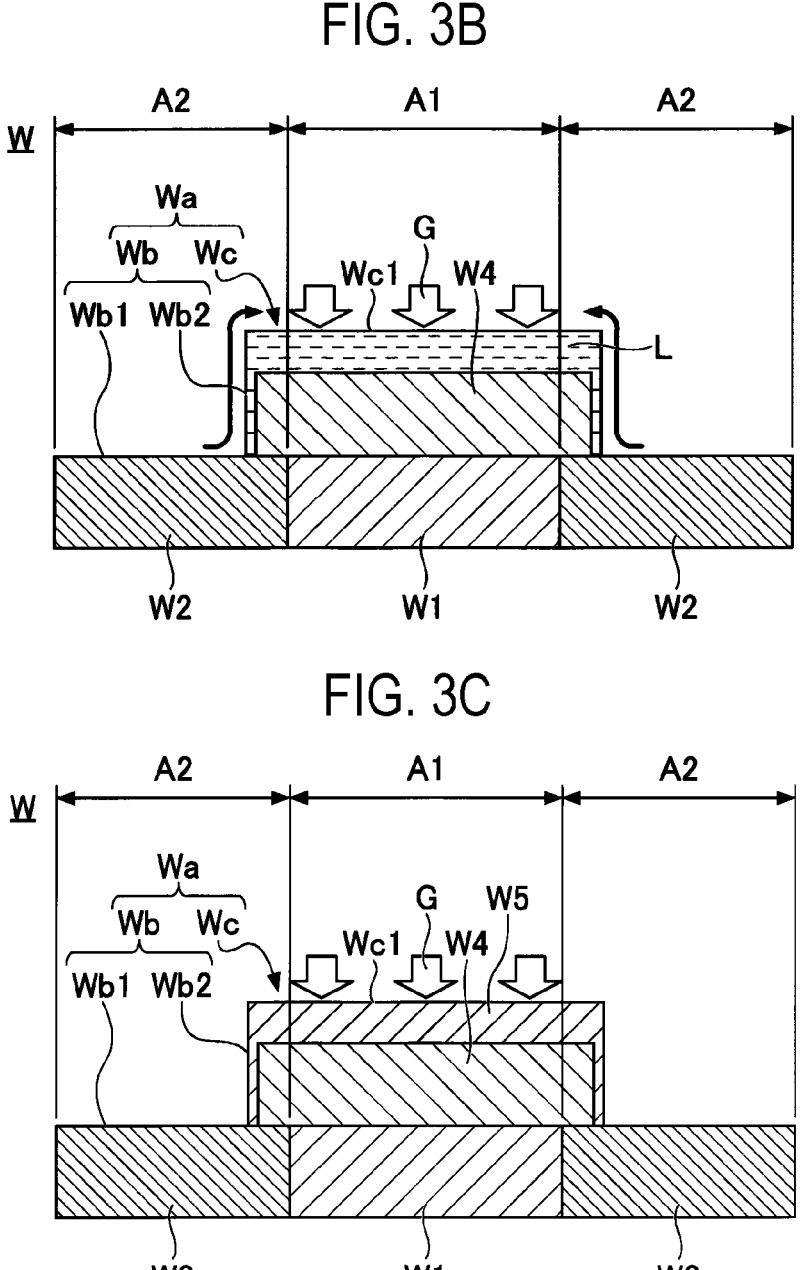
FIG. 3B is a cross-sectional view illustrating an example of a first process of step S4.
FIG. 3C is a cross-sectional view illustrating an example of a second process of step S4.

In step S4 of FIG. 1, as illustrated in FIG. 3B, a processing gas G that chemically changes the liquid L is supplied to the substrate surface Wa so that the liquid L is moved from the concave portion Wb to the top surface Wc1 of the convex portion by the reaction between the processing gas G and the liquid L. As illustrated in FIG. 3C, a film W5 is formed on the top surface Wc1 of the convex portion so that the stepped portion of the substrate surface Wa is expanded. A size of the stepped portion is represented by a depth of the concave portion Wb.

As illustrated in FIG. 3C, the film W5 may also be formed on the side surface Wb2 of the concave portion. When a thickness of the film W5 on the side surface Wb2 of the concave portion is smaller than that of the film W5 on the top surface Wc1 of the convex portion, the stepped portion in the substrate surface Wa can be expanded by forming the film W5, for example, even if the film W5 is isotropically etched.

In addition, although not illustrated, the film W5 may also be formed on the bottom surface Wb1 of the concave portion. When the thickness of the film W5 on the bottom surface Wb1 of the concave portion is smaller than that of the film W5 on the top surface Wc1 of the convex portion, the stepped portion in the substrate surface Wa can be expanded.

The film W5 may be a solid or a viscous body. The thickness of the film W5 may be controlled by the supply amount of the liquid L. The film W5 may have insulation property. The insulating film W5 will also be referred to as a third insulating film W5 hereinafter. The third insulating film W5 is, for example, a metal oxide film or a metal nitride film.

The processing gas G is supplied, for example, from above the substrate surface Wa, and reacts with the liquid L. The liquid L chemically changes by reacting with the processing gas G. Since the chemical change gradually proceeds from the surface of the liquid L, a difference in surface tension occurs, and volumetric expansion or contraction occurs from the surface of the liquid L, making liquid L unstable and causing convection. Since the surface of the liquid L changes into a substance with a strong surface tension due to the reaction with the processing gas G, the liquid L moves toward the top surface Wc1 of the convex portion. In addition, the liquid L moves toward the top surface Wc1 of the convex portion by being dragged by the increase and decrease in volume due to the chemical change on the surface of the liquid L. Although not illustrated, all of the liquid L may eventually move to the top surface Wc1 of the convex portion by the reaction with the processing gas G.

During the chemical change of the liquid L, degassing occurs from the liquid L due to the reaction between the liquid L and the processing gas G. The movement of the liquid L due to the occurrence of degassing is also considered to be a factor contributing to the movement of the liquid L. In addition, it is considered that minute vibrations of the substrate W may also be a factor contributing to the movement of the liquid L.

The processing gas G includes, for example, elements that are incorporated into the liquid L by the reaction with the liquid L. That is, the processing gas G includes elements that are incorporated into the film W5. For example, oxygen in the processing gas G is incorporated into the liquid L, so that an oxide film W5 is obtained. Alternatively, nitrogen in the processing gas G is incorporated into the liquid L, so that a nitride film W5 is obtained. The elements in the processing gas G only need to be incorporated into the liquid L, and the elements constituting the liquid L may be degassed during the process.

For example, the processing gas G includes an oxygen-containing gas. The oxygen-containing gas contains oxygen as an element to be incorporated into the liquid L. The oxygen-containing gas may further contain nitrogen as an element to be incorporated into the liquid L. The oxygen-containing gas includes, for example, an $O_2$ gas, an $O_3$ gas, a $H_2O$ gas, a NO gas, or a $N_2O$ gas.

The processing gas G may include a nitrogen-containing gas. The nitrogen-containing gas includes nitrogen as an element to be incorporated into the liquid L. The nitrogen-containing gas includes, for example, a $N_2$ gas, a $NH_3$ gas, a $N_2H_4$ gas, or a $N_2H_2$ gas.

The processing gas G may include a hydride gas. The hydride gas contains, as the element to be incorporated into the liquid L, an element bonded to hydrogen, such as Si, Ge, B, C, or P. The hydride gas includes, for example, a hydrocarbon gas such as a $SiH_4$ gas, a $Si_2H_6$ gas, a $GeH_4$ gas, a $B_2H_6$ gas, a $C_2H_4$ gas, or a $PH_3$ gas.

The processing gas G may degas the elements constituting the liquid L by the reaction with the liquid L. For example, the processing gas G includes a reducing gas. The reducing gas is, for example, a hydrogen ($H_2$) gas or a deuterium ($D_2$) gas.

The processing gas G may be supplied together with an inert gas such as an argon gas.

Step S4 may include plasmarizing the processing gas G. By the plasmarization, the reaction between the processing gas G and the liquid L can be promoted.

In step S5 in FIG. 1, the film W5 formed in step S4 is modified. The modified film W5 has better chemical resistance than the unmodified member W5. For example, the modified film W5 has a lower etching rate with respect to diluted hydrofluoric acid (DHF) than the unmodified film W5.

The modifying of the film W5 includes, for example, at least one of the following (A) and (B). (A) A halogen element or hydrogen element in the film W5 is reduced. (B) The film W5 is densified. The densification of the film W5 can be achieved, for example, by terminating dangling bonds in the film W5 with an element contained in a modification gas, or by promoting bonds between existing elements in the film W5.

In step S5, the modification gas may be supplied to the film W5. When the modification gas in step S5 and the processing gas G in step S4 are the same gas, these gases are supplied under different conditions. Specifically, for example, while the modification gas is plasmarized, the processing gas G is not plasmarized. Alternatively, the modification gas is supplied at a higher temperature or at a higher pressure than the processing gas G.

However, the modification gas in step S5 and the processing gas G in step S4 may be different gases. For example, while the processing gas G is a nitrogen gas and is plasmarized, the modification gas is an ammonia ($NH_3$) gas and is plasmarized, or is a hydrazine ($N_2H_4$) gas. Alternatively, while the process gas G is an oxygen ($O_2$) gas, the modification gas is an ozone (O3) gas or water vapor ($H_2O$).

In step S6 of FIG. 1, it is confirmed whether a first cycle has been executed M times (M is an integer of 1 or more). A single round of first cycle includes steps S3 to S5 described above. The first cycle only needs to include at least steps S3 and S4, and may not include step S5. M may be an integer of 2 or more.

When the number of executions of the first cycle is less than M times (step S6, "NO"), the size of the stepped portion in the substrate surface Wa is less than a target value, and thus the first cycle is performed again. M is not particularly limited, but is, for example, from 2 to 30, preferably from 5 to 20.

It is sufficient that while the first cycle is performed M times, adjacent side surfaces Wb2 of the concave portion are not connected to each other and the concave portion Wb is not closed. This is because if the concave portion Wb is closed, the stepped portion will disappear. The upper limit value of M is set so that the concave portion Wb is not closed.

Figure 4A:
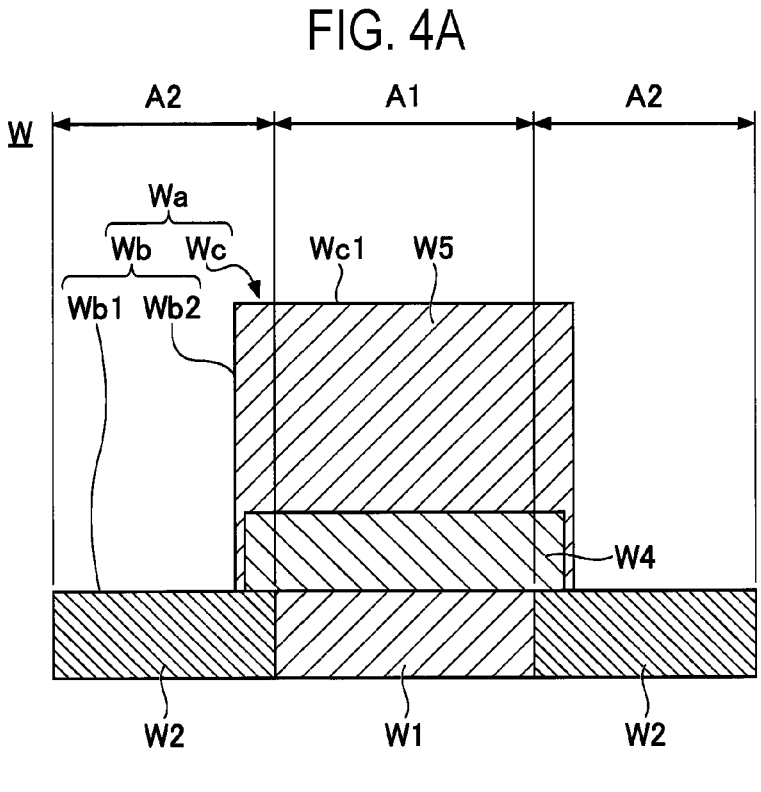
FIG. 4A is a cross-sectional view illustrating an example immediately before step S7.
Figure 4B:
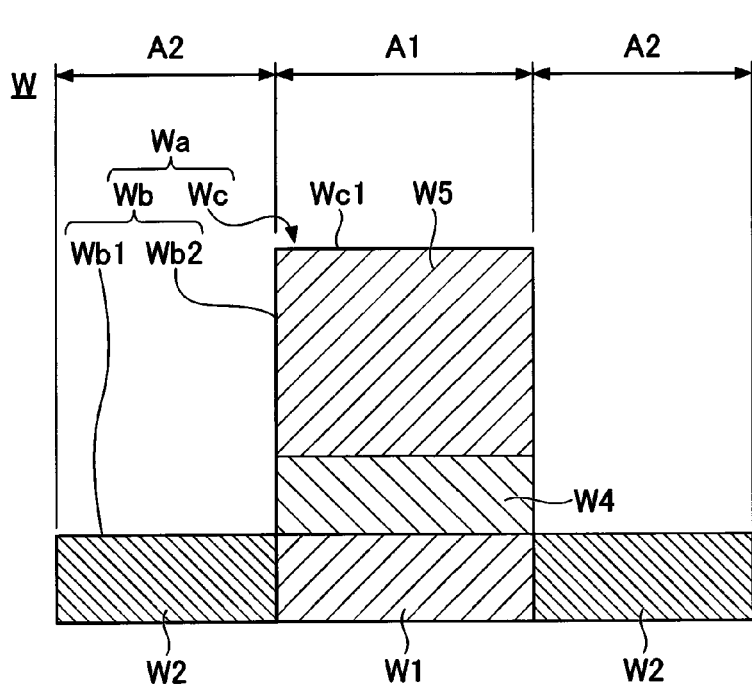
FIG. 4B is a cross-sectional view illustrating an example immediately after step S7.

On the other hand, when the number of executions of the first cycle reaches M times (step S6, "YES"), the size of the stepped portion in the substrate surface Wa reaches the target value, and thus the processes of step S7 and subsequent steps are performed. An example of the substrate W immediately before step S7 is illustrated in FIG. 4A, and an example of the substrate W immediately after step S7 is illustrated in FIG. 4B.

In step S7 of FIG. 1, a portion of the film W5 is etched. By etching, as illustrated in FIG. 4B, portions of the second insulating film W4 and the third insulating film W5 that protrude from the first region A1 can be removed. After the etching, the bottom surface Wb1 of the concave portion is formed by a conductive film which is the second film W2, the side surface Wb2 of the concave portion is formed by the second insulating film W4 and the third insulating film W5, and the top surface Wc1 of the convex portion is formed by the third insulating film W5.

According to the present embodiment, the third insulating film W5 is formed on the second insulating film W4 before etching the portion of the second insulating film W4 that protrudes from the first region A1. A thickness of the insulating film can be increased by the third insulating film W5, which makes it possible to cope with a decrease in the thickness of the insulating film due to etching. As a result, the thickness of the insulating film can be increased without causing the insulating film to protrude from the first region A1.

The etching may be either isotropic etching or anisotropic etching. The isotropic etching and the anisotropic etching may be used in combination. The isotropic etching is capable of etching not only the bottom surface Wb1 of the concave portion and the top surface Wc1 of the convex portion, but also the side surfaces Wb2 of the concave portion so that the portion protruding from the first region A1 can be removed. On the other hand, the anisotropic etching is capable of selectively etching the bottom surface Wb1 of the concave portion and the top surface Wc1 of the convex portion with respect to the side surfaces Wb2 of the concave portion.

The etching may be either dry etching or wet etching, but the dry etching is preferable. In the dry etching, an etching gas is supplied to the substrate surface Wa. In the dry etching, a $H_2$ gas, an $O_2$ gas, a $NH_3$ gas, or the like may be supplied to the substrate surface Wa along with the etching gas.

When the dry etching is thermal etching, for example, a $Cl_2$ gas, a $ClF_3$ gas, a $F_2$ gas, a HF gas, or the like is used as the etching gas. On the other hand, when the dry etching is plasma etching, for example, a $Cl_2$ gas, a $CF_4$ gas, a $CHF_3$ gas, a $C_4F_8$ gas, a $SF_6$ gas, or the like is used as the etching gas to be plasmarized.

In the etching, the etching gas and the reaction gas may be supplied alternately, as in atomic layer etching (ALE). As the etching gas, for example, a $Cl_2$ gas, a $CF_4$ gas, a $C_4F_8$ gas, a $WF_6$ gas, or the like is used. As the reaction gas, an Ar gas, a He gas, a $H_2$ gas, a $BCl_3$ gas, or the like is used. The reaction gas may be supplied after being plasmarized.

A second cycle includes performing the first cycle M times and performing step S7 after performing the first cycle M times. The second cycle is performed only once in FIG. 1, but may be performed multiple times. In addition, the etching may be further performed after the second cycle is performed multiple times. Ultimately, it is only necessary to remove the portions of the second insulating film W4 and the third insulating film W5 that protrude from the first region A1.

Figures 5A, 5B, 5C:
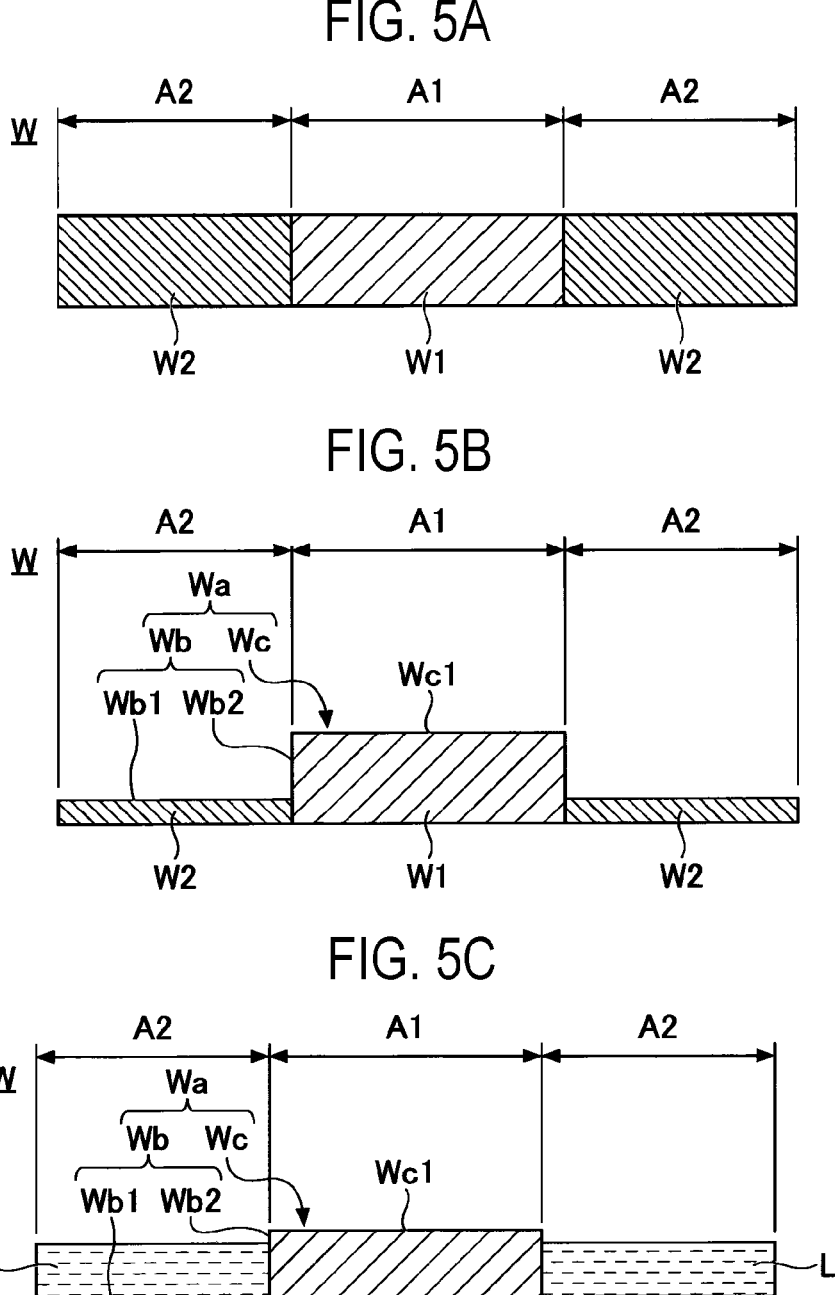
FIG. 5A is a cross-sectional view illustrating a modification of step S1.
FIG. 5B is a cross-sectional view illustrating a modification of step S2.
FIG. 5C is a cross-sectional view illustrating a modification of step S3.

Step S2 in the above-described embodiment includes selectively forming the second insulating film W4 in the first region A1 with respect to the second region A2. On the other hand, step S2 of the following modification includes selectively etching the second region A2 with respect to the first region A1, as illustrated in FIGS. 5A and 5B.

In this modification as well, the stepped portion formed in step S2 is expanded. The substrate surface Wa before the stepped portion is expanded includes a concave portion Wb and a convex portion Wc, which are adjacent to each other, as illustrated in FIG. 5B. The concave portion Wb is a trench, a hole, or the like. The hole includes a via hole. The convex portion Wc may be a pillar, a fin, or the like.

The substrate surface Wa includes, for example, the bottom surface Wb1 of the concave portion, the side surfaces Wb2 of the concave portion, and the top surface Wc1 of the convex portion. For example, the top surface Wc1 of the convex portion is a flat surface, and the concave portion Wb is recessed from the top surface Wc1 of the convex portion. The depth of the concave portion Wb represents the size of the stepped portion. The bottom surface Wb1 of the concave portion is formed of a conductive film which is the second film W2. On the other hand, the side surfaces Wb2 of the concave portion and the top surface Wc1 of the convex portion are formed by an insulating film which is the first film W1.

Figures 5D, 6A:
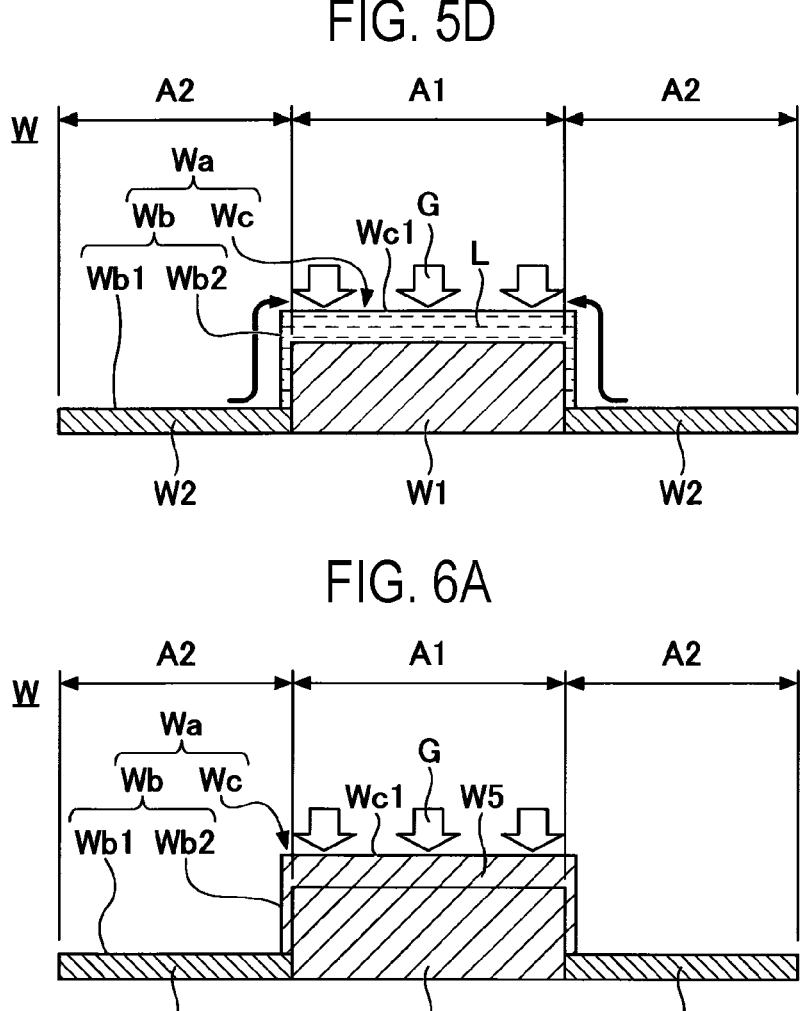
FIG. 5D is a cross-sectional view illustrating a modification of a first process of step S4.
FIG. 6A is a cross-sectional view illustrating a modification of a second process of step S4.

Since steps S3 to S7 are the same as in the above-described embodiment, detailed descriptions thereof will be omitted and brief descriptions will be given. In step S3, as illustrated in FIG. 5C, the liquid L is supplied to the substrate surface Wa. In step S4, the processing gas G that chemically changes the liquid L is supplied to the substrate surface Wa so that the liquid L is moved from the concave portion Wb to the top surface Wc1 of the convex portion by the reaction between the processing gas G and the liquid L, as illustrated in FIG. 5D, and the third insulating film W5 is formed on the top surface Wc1 of the convex portion so that the stepped portion of the substrate surface Wa is expanded, as illustrated in FIG. 6A. In step S5, the third insulating film W5 formed in step S4 is modified. In step S6, it is confirmed whether the first cycle has been executed M times (M is an integer of 1 or more). When the number of executions of the first cycle is less than M times (step S6, "NO"), the size of the stepped portion in the substrate surface Wa is less than a target value, and thus the first cycle is performed again. On the other hand, when the number of executions of the first cycle reaches M times (step S6, "YES"), the size of the stepped portion in the substrate surface Wa reaches the target value, and thus the processes of step S7 and subsequent steps are performed. An example of the substrate W immediately before step S7 is illustrated in FIG. 6B, and an example of the substrate W immediately after step S7 is illustrated in FIG. 6C. In step S7, a portion of the third insulating film W5 is etched. By the etching, as illustrated in FIG. 6C, the portion of the third insulating film W5 that protrudes from the first region A1 can be removed. After the etching, the bottom surface Wb1 of the concave portion is formed by a conductive film which is the second film W2, the side surface Wb2 of the concave portion is formed by an insulating film which is the first insulating film W1 and the third insulating film W5, and the top surface Wc1 of the convex portion is formed by the third insulating film W5.

Next, a film forming device 1 will be described with reference to FIG. 7. The film forming device 1 includes a substantially cylindrical hermetically-sealed processing container 2. An exhaust chamber 21 is provided in the central portion of a bottom wall of the processing container 2. The exhaust chamber 21 has, for example, a substantially cylindrical shape that protrudes downward. An exhaust pipe 22 is connected to the exhaust chamber 21, for example, on a side surface of the exhaust chamber 21.

An exhauster 24 is connected to the exhaust pipe 22 via a pressure adjuster 23. The pressure adjuster 23 includes a pressure adjustment valve such as a butterfly valve. The exhaust pipe 22 is configured such that an internal pressure of the processing container 2 can be reduced by the exhauster 24. The processing container 2 is provided with a transfer port 25 on its side. The transfer port 25 is opened and closed by a gate valve 26. The loading/unloading the substrate W between an interior of the processing container 2 and the transfer chamber (not illustrated) is performed via the transfer port 25.

A stage 3 is provided inside the processing container 2. The stage 3 is a holder that holds the substrate W horizontally in a state where the surface Wa of the substrate W is oriented upward. The stage 3 has a substantially circular shape in a plan view and is supported by a support member 31. A substantially circular recess 32 is formed in a surface of the stage 3 to place therein the substrate W having, for example, a diameter of 300 mm. The recess 32 has an inner diameter slightly larger than that of the substrate W. A depth of the recess 32 is substantially the same as, for example, a thickness of the substrate W. The stage 3 is made of a ceramic material such as aluminum nitride (AlN). The stage 3 may be made of a metal material such as nickel (Ni). Instead of the recess 32, a guide ring configured to guide the substrate W may be provided at a peripheral edge of the surface of the stage 3.

For example, a grounded lower electrode 33 is embedded in the stage 3. A heater 34 is embedded below the lower electrode 33. The heater 34 heats the substrate W placed on the stage 3 to a set temperature by receiving power from a power supply (not illustrated) based on a control signal from a controller 100 (see FIGS. 5A to 5D). When the entire stage 3 is made of metal, the entire stage 3 functions as a lower electrode, so that the lower electrode 33 does not have to be embedded in the stage 3. The stage 3 is provided with a plurality of (e.g., three) lifting pins 41 configured to hold and lift the substrate W placed on the stage 3. A material of the lifting pins 41 may be, for example, ceramic such as alumina (Al$_2$O$_3$), quartz, or the like. Lower ends of the lifting pins 41 are installed on a support plate 42. The support plate 42 is connected to a lifting mechanism 44 provided outside the processing container 2 via a lifting shaft 43.

The lifting mechanism 44 is installed, for example, under the exhaust chamber 21. A bellows 45 is provided between an opening 211 for the lifting shaft 43 formed in the bottom surface of the exhaust chamber 21 and the lifting mechanism 44. The support plate 42 may have a shape that can be raised/lowered without interfering with the support member 31 of the stage 3. The lifting pins 41 are configured to be raised/lowered by the lifting mechanism 44 between above the surface of the stage 3 and below the surface of the stage 3.

A gas supplier 5 is provided on the ceiling wall 27 of the processing container 2 via an insulating member 28. The gas supplier 5 constitutes an upper electrode and faces the lower electrode 33. A radio-frequency power supply 512 is connected to the gas supplier 5 via a matcher 511. By supplying radio-frequency power of 450 kHz to 100 MHz from the radio-frequency power supply 512 to the upper electrode (the gas supplier 5), a radio-frequency electric field is generated between the upper electrode (the gas supplier 5) and the lower electrode 33 and generates capacitively coupled plasma. A plasma generator 51 includes the matcher 511 and the radio-frequency power supply 512. The plasma generator 51 may generate other plasma such as inductively coupled plasma, in addition to the capacitively coupled plasma.

The gas supplier 5 includes a hollow gas supply chamber 52. In a bottom surface of the gas supply chamber 52, for example, a large number of holes 53 configured to disperse and supply a processing gas into the processing container 2 are evenly arranged. A heating mechanism 54 is embedded in the gas supplier 5, for example, above the gas supply chamber 52. The heating mechanism 54 is heated to a set temperature by being fed with power from a power supply (not illustrated) based on a control signal from the controller 100.

The gas supply chamber 52 is provided with a gas supply path 6. The gas supply path 6 communicates with the gas supply chamber 52. Gas sources G61, G62, G63, G64, G65, and G66 are connected to upstream sides of the gas supply path 6 via gas lines L61, L62, L63, L64, L65, and L66, respectively.

The gas source G61 is TiCl$_4$ gas source, and is connected to the gas supply path 6 via the gas line L61. The gas line L61 is provided with a mass flow controller M61, a storage tank T61, and a valve V61 in that order from the side of the gas source G61. The mass flow controller M61 controls a flow rate of the TiCl$_4$ gas flowing through the gas line L61. The storage tank T61 may store the TiCl$_4$ gas supplied from the gas source G61 via the gas line L61 in the state in which the valve V61 is closed, so that a pressure of the TiCl$_4$ gas in the storage tank T61 can be increased. The valve V61 performs the supply and cutoff of the TiCl$_4$ gas with respect to the gas supply path 6 by opening and closing operations.

The gas source G62 is an Ar gas source, and is connected to the gas supply path 6 via the gas line L62. The gas line L62 is provided with a mass flow controller M62 and a valve V62 in that order from the side of the gas source G62. The mass flow controller M62 controls a flow rate of the Ar gas flowing through the gas line L62. The valve V62 performs the supply and cutoff of the Ar gas with respect to the gas supply path 6 by opening and closing operations.

The gas source G63 is an $O_2$ gas source, and is connected to the gas supply path 6 via the gas line L63. The gas line L63 is provided with a mass flow controller M63 and a valve V63 in that order from the side of the gas source G63. The mass flow controller M63 controls a flow rate of the $O_2$ gas flowing through the gas line L63. The valve V63 performs the supply and cutoff of the $O_2$ gas with respect to the gas supply path 6 by opening and closing operations.

The gas source G64 is a $H_2$ gas source, and is connected to the gas supply path 6 via the gas line L64. The gas line L64 is provided with a mass flow controller M64 and a valve V64 in that order from the side of the gas source G64. The mass flow controller M64 controls a flow rate of the $H_2$ gas flowing through the gas line L64. The valve V64 performs the supply and cutoff of the $H_2$ gas with respect to the gas supply path 6 by opening and closing operations.

The gas source G65 is a $ClF_3$ gas source, and is connected to the gas supply path 6 via the gas line L65. The gas line L65 is provided with a mass flow controller M65 and a valve V65 in that order from the side of the gas source G65. The mass flow controller M65 controls a flow rate of the $ClF_3$ gas flowing through the gas line L65. The valve V65 performs the supply and cutoff of the $ClF_3$ gas with respect to the gas supply path 6 by opening and closing operations.

The gas source G66 is a source of a stepped-portion forming gas, and is connected to the gas supply path 6 via the gas line L66. The gas line L66 is provided with a mass flow controller M66 and a valve V66 in that order from the side of the gas source G66. The mass flow controller M66 controls a flow rate of the stepped-portion forming gas flowing through the gas line L66. The valve V66 performs the supply and cutoff of the stepped-portion forming gas with respect to the gas supply path 6 by opening and closing operations.

The stepped-portion forming gas is a gas used to form a stepped portion. The stepped-portion forming gas is, for example, a combination of an organic compound which is a raw material for the self-assembled monomolecular film W3, and a metal-containing gas or an oxidizing gas (or a nitriding gas or the like) which is a raw material for the second insulating film W4. Alternatively, the stepped-portion forming gas is an etching gas that etches the conductive film which is the first film W1. When there is a plurality of stepped-portion forming gases, the gas source G66 and the gas line L66 are provided for each stepped-portion forming gas.

The film forming device 1 includes the controller 100 and a storage 101. The controller 100 includes a CPU, RAM, ROM, and the like (all of which are not illustrated) and exclusively controls the film forming device 1 by causing the CPU to execute, for example, a computer program stored in the ROM or storage 101. Specifically, the controller 100 causes the CPU to execute a control program stored in the storage 101 to control the operation of each component of the film forming device 1, thereby performing a film-forming process or the like on the substrate W.

Next, referring again to FIG. 7, the operation of the film forming device 1 will be described. First, the controller 100 opens the gate valve 26 and transfers the substrate W into the processing container 2 and places the substrate W on the stage 3 by the transfer mechanism. The substrate W is placed horizontally with the surface Wa oriented upward. The controller causes the transfer mechanism to be retracted from the interior of the processing container 2 and closes the gate valve 26. Subsequently, the controller 100 heats the substrate W to a predetermined temperature by the heater 34 of the stage 3 and adjusts the internal pressure of the processing container 2 to a predetermined pressure by the pressure adjuster 23. For example, loading the substrate W into the processing container 2 and the like are included in step S1 in FIG. 1.

Subsequently, in step S2 of FIG. 1, the controller 100 opens the valve V66 to supply the stepped-portion forming gas into the processing container 2. The valves V61, V62, V63, V64, and V65 are closed. In addition, the Ar gas, the $O_2$ gas, or the like may be supplied into the processing container 2 together with the stepped-portion forming gas. The concave portion Wb and the convex portion Wc are formed on the substrate surface Wa by the stepped-portion forming gas.

Next, in step S3 of FIG. 1, the controller 100 opens the valves V61, V62, and V64, and supplies the $TiCl_4$ gas, the Ar gas, and the $H_2$ gas into the processing container 2 at the same time. The valves V63, V65, and V66 are closed. Due to the reaction between the $TiCl_4$ gas and the $H_2$ gas, the liquid L such as $TiH_xCl_y$ is supplied to the concave portion Wb of the substrate W.

Specific processing conditions in step S3 are, for example, as follows.

Flow rate of $TiCl_4$ gas: 1 sccm to 100 sccm

Flow rate of Ar gas: 10 sccm to 100,000 sccm, preferably 100 sccm to 20,000 sccm Flow rate of $H_2$ gas: 1 sccm to 50,000 sccm, preferably 10 sccm to 10,000 sccm Processing time: 1 second to 1,800 seconds Processing temperature: −100 degrees C. to 390 degrees C., preferably 20 degrees C. to 350 degrees C.

Processing pressure: 0.1 Pa to 10,000 Pa, preferably 0.1 Pa to 2,000 Pa

In step S3, the controller 100 may generate plasma by the plasma generator 51 to promote the reaction between the $TiCl_4$ gas and the $H_2$ gas. When supplying the $TiCl_4$ gas and the $H_2$ gas at the same time, the controller 100 plasmarizes both the $TiCl_4$ gas and the $H_2$ gas.

In step S3, the controller 100 may alternately supply the $TiCl_4$ gas and the $H_2$ gas into the processing container 2 instead of supplying the gases at the same time. In this case, the controller 100 may plasmarize only the $H_2$ gas out of the $TiCl_4$ gas and the $H_2$ gas.

After step S3, the valves V61 and V64 are closed. At this time, since the valve V62 is open, Ar is supplied into the processing container 2, the gas remaining in the processing container 2 is discharged to the exhaust pipe 22, and the interior of the processing container 2 is replaced with an Ar atmosphere.

Next, in step S4 of FIG. 1, the controller 100 opens the valve V63 and supplies the $O_2$ gas into the processing container 2 together with the Ar gas. Due to the reaction between the $O_2$ gas and the liquid L, the liquid L moves from the concave portion Wb to the top surface Wc1 of the convex portion, and the third film W5 is formed on the top surface Wc1 of the convex portion. As a result, the stepped portion in the substrate surface Wa is expanded.

Specific processing conditions in step S4 are, for example, as follows.

Flow rate of $O_2$ gas: 1 sccm to 100,000 sccm, preferably 1 sccm to 10,000 sccm Flow rate of Ar gas: 10 sccm to 100,000 sccm, preferably 100 sccm to 20,000 sccm

Processing time: 1 second to 1,800 seconds

Processing temperature: −100 degrees C. to 390 degrees C., preferably 20 degrees C. to 350 degrees C.

Processing pressure: 0.1 Pa to 10,000 Pa, preferably 0.1 Pa to 2,000 Pa

Next, in step S5 of FIG. 1, like step S4, the controller 100 supplies the $O_2$ gas into the processing container 2 together with the Ar gas. Further, in step S5, unlike step S4, the controller 100 generates plasma by the plasma generator 51 to modify the third film W5. Specific processing conditions in step S5 are the same as those in step S4, except for the generation of plasma, and therefore a description thereof will be omitted.

After step S5, the valve V63 is closed. At this time, since the valve V62 is open, Ar is supplied into the processing container 2, the gas remaining in the processing container 2 is discharged to the exhaust pipe 22, and the interior of the processing container 2 is replaced with an Ar atmosphere.

Next, in step S6 of FIG. 1, the controller 100 confirms whether or not the first cycle has been executed M times (M is a natural number of 1 or more). A single round of first cycle includes steps S3 to S5 described above. The first cycle only needs to include at least steps S3 and S4, and may not include step S5.

16

After step S7, the controller 100 unloads the substrate W from the processing container 2 in a procedure reverse to loading the substrate W into the processing container 2.

EXAMPLES

Next, examples and the like will be described. Among Examples 1 to 18 below, Example 1 is an example of the present disclosure, and Examples 1 to 11 and 13 are reference examples. In Examples 1 to 18, before the substrates W are loaded into the processing container 2 illustrated in FIG. 7, concave portions and convex portions were formed in advance in the substrate surfaces Wa. Hereinafter, the top surfaces Wc1 of the convex portions formed in advance will also be referred to as "convex top surfaces Wd."

Examples 1 to 2

Figure 7:
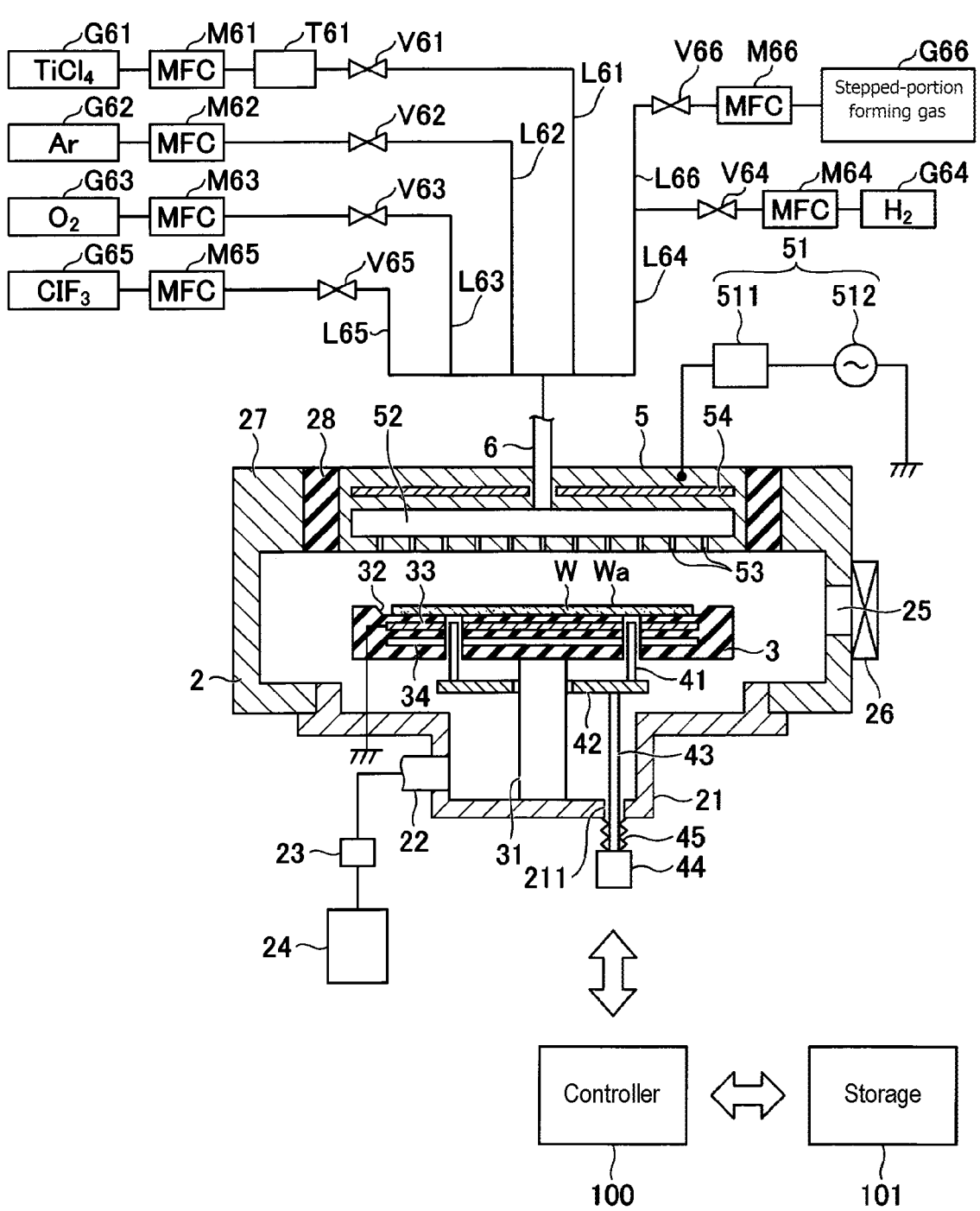
FIG. 7 is a cross-sectional view illustrating a film forming device according to an embodiment.

In Examples 1 and 2, steps S1 to S4 and S6 were performed by using the film forming device 1 illustrated in FIG. 7 under the processing conditions shown in Table 1, and steps S5 and S7 were not performed. In addition, as described above, before the substrates W are loaded into the processing container 2, concave portions and convex portions were formed in advance in the substrate surfaces Wa.

TABLE 1

| | Convex top surface | Concave bottom surface | Steps | Temperature [degrees C.] | TiCl$_4$ | H$_2$ | Ar | Other supplied gas | RF | Time [sec] | Number of Cycles |
|---|---|---|---|---|---|---|---|---|---|---|---|
| Example 1 | SiO$_2$ | SiO$_2$ | S3 | 130 | ○ | ○ | ○ | — | ON | 60 | 1 |
| | | | S4 | 130 | — | — | ○ | O$_2$ | — | 60 | 1 |
| Example 2 | SiO$_2$ | SiO$_2$ | S3 | 130 | ○ | ○ | ○ | — | ON | 300 | 1 |
| | | | S4 | 130 | — | — | ○ | O$_2$ | — | 60 | 1 |

When the number of executions of the first cycle is less than M times (step S6, "NO"), the controller 100 performs the first cycle again. On the other hand, when the number of executions of the first cycle reaches M times (step S6, "YES"), the controller 100 performs step S7.

Next, in step S7 of FIG. 1, the controller 100 opens the valve V65 and supplies the $ClF_3$ gas into the processing container 2 together with the Ar gas. A portion of the second insulating film W4 and a portion of the third insulating film W5 are etched by the $ClF_3$ gas. In addition, in step S7, the controller 100 may generate plasma by the plasma generator 51, or may plasmarize the $ClF_3$ gas.

Specific processing conditions in step S7 are, for example, as follows.

Flow rate of $ClF_3$ gas: 1 sccm to 100 sccm

Flow rate of Ar gas: 10 sccm to 100,000 sccm, preferably 100 sccm to 20,000 sccm Processing time: 1 second to 1,800 seconds Processing temperature: 30 degrees C. to 350 degrees C., preferably 80 degrees C. to 200 degrees C.

Processing pressure: 0.1 Pa to 10,000 Pa, preferably 0.1 Pa to 2,000 Pa

After step S7, the valve V65 is closed. At this time, since the valve V62 is open, Ar is supplied into the processing container 2, the gas remaining in the processing container 2 is discharged to the exhaust pipe 22, and the interior of the processing container 2 is replaced with an Ar atmosphere.

In addition, step S7 and steps S3 to S5 are performed inside the same processing container 2 in the present embodiment, but may be performed inside different processing containers 2.

In Table 1, the "convex top surfaces" have the same material as the convex top surfaces Wd formed in advance before performing step S3. The material of the side surfaces of the concave portions formed in advance before performing step S3 is the same as the material of the convex top surfaces Wd. The "concave bottom surfaces" have the same material as the bottom surfaces of the concave portions formed in advance before performing step S3. In addition, "○" for various gases means that the various gases were supplied, and "ON" for "RF" means that the gases was plasmarized by RF power. In addition, the "number of cycles" is the number of repetitions of steps S3 and S4 (that is, M in step S6). This holds true in Tables 2 to 8 which will be described later.

Figure 8A:
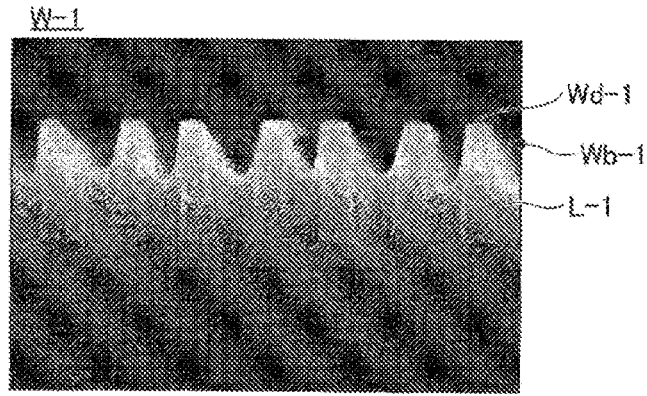
FIG. 8A is a SEM photograph of a substrate according to Example 1, taken after step S3 and before step S4.
Figure 8B:
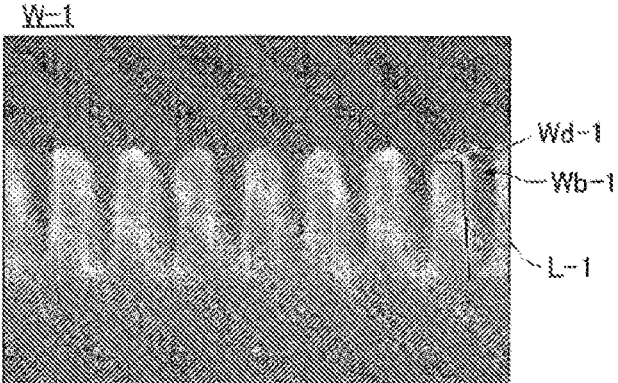
FIG. 8B is a SEM photograph of the substrate according to Example 1, taken in the middle of step S4.
Figures 8C, 9A, 9B:
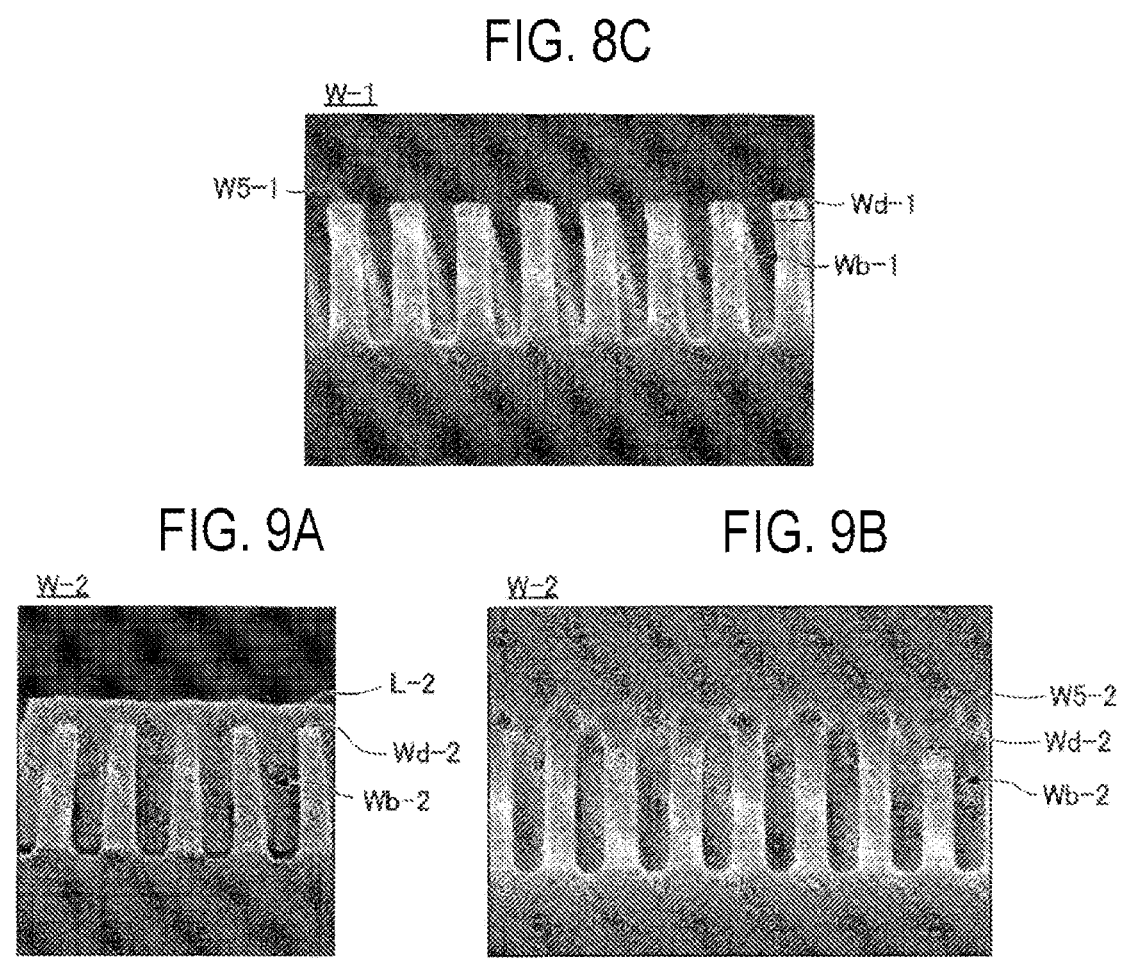

FIGS. 8A to 8C show SEM photographs of a substrate W-1 according to Example 1. As shown in FIG. 8A, a liquid L-1 was supplied to the concave portions Wb-1 in step S3. The supply amount of the liquid L-1 was sufficient to be accommodated in the concave portions Wb-1. In addition, as shown in FIG. 8B, when the processing was interrupted in the middle of step S4, specifically, when the processing time of step S4 was 10 seconds, a situation similar to FIG. 3B, that is, the situation where the liquid L-1 crawled up from the concave portions Wb-1 toward the convex top surfaces Wd-1, was confirmed. In addition, as shown in FIG. 8C, by step S4, a film W5-1 was selectively formed on the top convex surfaces Wd-1.

FIGS. 9A and 9B show SEM photographs of a substrate W-2 according to Example 2. As shown in FIG. 9A, the liquid L-2 was supplied to the concave portions Wb-2 in step S3. In Example 2, since the processing time in step S3 was longer than that in Example 1 and thus the supply amount of the liquid L-2 was larger, the liquid L-2 was supplied not only to the concave portions Wb-2 but also to the convex top surfaces Wd-2. In addition, as shown in FIG. 9B, by step S4, a film W5-2 was selectively formed on the top convex surfaces Wd-2.

Example 3

In Example 3, by using the film forming device 1 shown in FIG. 7, steps S1 to S3 were performed under the processing conditions shown in Table 2, and then step S9 was performed under the processing conditions shown in Table 2 without performing steps S4 to S7. In step S9, only the Ar gas was supplied into the processing container 2, and changes in the liquid L in the concave portions Wb were observed.

TABLE 2

| | Convex top surface | Concave bottom surface | Steps | Temperature [degrees C.] | $TiCl_4$ | $H_2$ | Ar | Other supplied gas | RF | Time [sec] |
|---|---|---|---|---|---|---|---|---|---|---|
| Example 3 | $SiO_2$ | $SiO_2$ | S3 | 130 | ○ | ○ | ○ | — | ON | 120 |
| | | | S9 | 130 | — | — | ○ | — | — | — |

Figures 10, 11A:
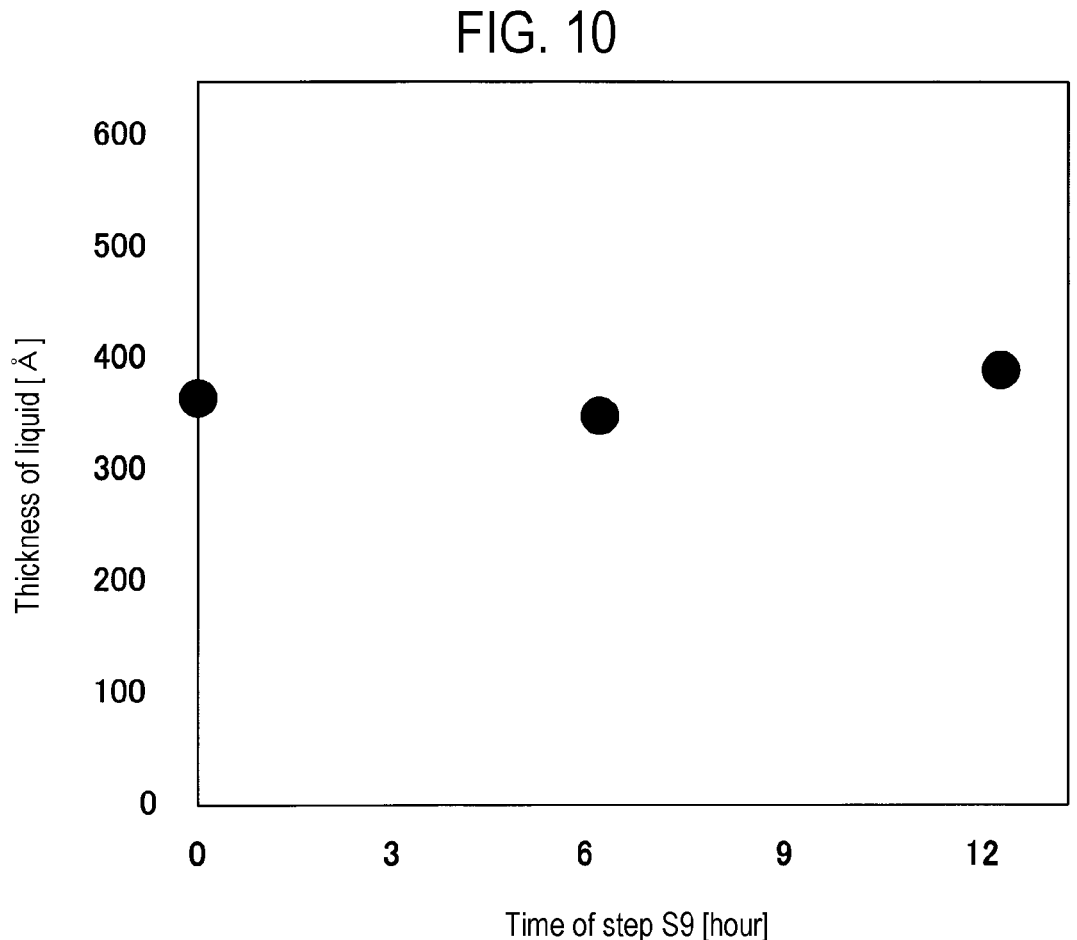
FIG. 10 is a diagram illustrating a relationship between a processing time in step S9 (Table 2) and a thickness of the liquid in concave portions according to Example 3.
FIG. 11A is a SEM photograph of a substrate according to Example 4 after processing.

FIG. 10 shows a relationship between the processing time in step S9 and the thickness of the liquid L in the concave portions Wb according to Example 3. As is clear from FIG. 10, no movement or reduction of the liquid L in the concave portions Wb was observed even after being left in a reduced-pressure atmosphere for a long period of time. This means that the liquid L does not move until the reaction between the liquid L and the processing gas G is initiated, and that the liquid L has a strong intermolecular force and strong cohesive force, and therefore is difficult to evaporate.

Examples 4 to 7

In Examples 4 to 7, steps S1 to S4 and S6 were performed by using the film forming device 1 illustrated in FIG. 7 under the processing conditions shown in Table 3, and steps S5 and S7 were not performed. In addition, as described above, before the substrates W are loaded into the processing container 2, concave portions and convex portions were formed in advance on the substrate surfaces Wa.

FIG. 11A shows a SEM photograph of a substrate W-4 after processing according to Example 4. In Example 4, like Example 1, step S3 and step S4 were performed once each. As a result, a film W5-4 was selectively formed on the convex top surfaces Wd-4 among the concave portions Wb-4 and the convex top surfaces Wd-4.

Figure 11B:
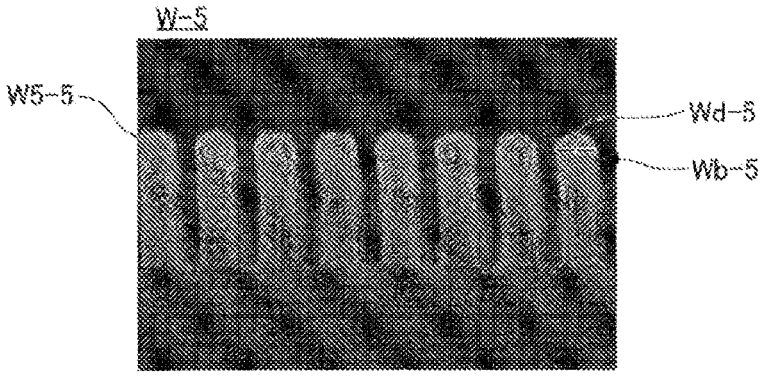
FIG. 11B is a SEM photograph of a substrate according to Example 5 after processing.

FIG. 11B shows a SEM photograph of a substrate W-5 after processing according to Example 5. In Example 5, unlike Example 1, steps S3 and S4 were performed ten times each. As a result, a film W5-5 was selectively formed on the convex top surfaces Wd-5 among the concave portions Wb-5 and the convex top surfaces Wd-5.

Figure 11C:
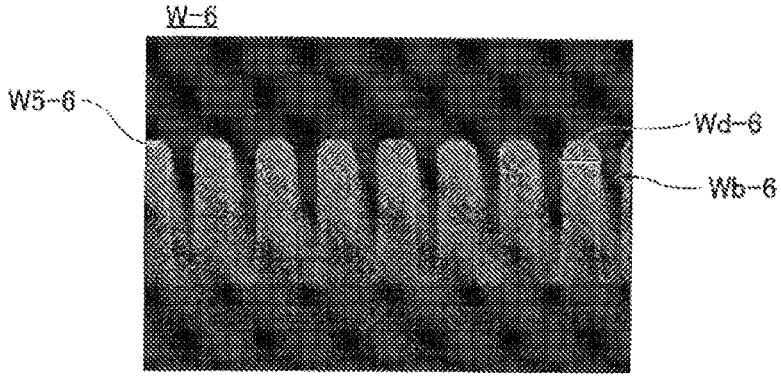
FIG. 11C is a SEM photograph of a substrate according to Example 6 after processing.

FIG. 11C shows a SEM photograph of a substrate W-6 according to Example 6 after processing. In Example 6, unlike Example 1, the $H_2O$ gas was supplied into the processing container 2 instead of the $O_2$ gas in step S4. As a result, a film W5-6 was selectively formed on the convex top surfaces Wd-6 among the concave portions Wb-6 and the convex top surfaces Wd-6.

Figure 11D:
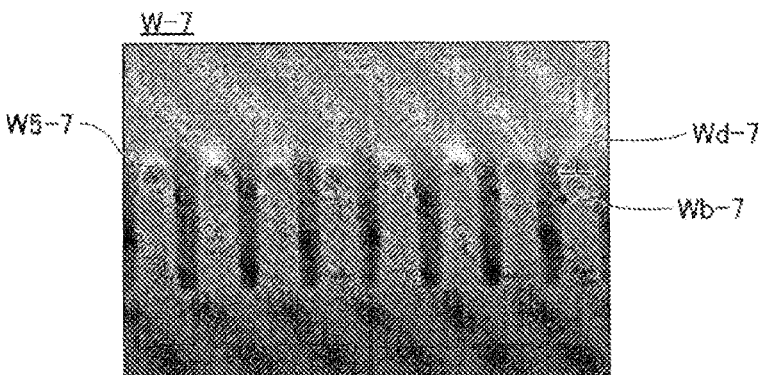
FIG. 11D is a SEM photograph of a substrate according to Example 7 after processing.

FIG. 11D shows a SEM photograph of a substrate W-7 after processing according to Example 7. In Example 7, unlike Example 1, the $N_2$ gas was supplied into the processing container 2 instead of the $O_2$ gas in step S4. In addition, the $N_2$ gas was plasmarized. As a result, a film W5-7 was selectively formed on the convex top surfaces Wd-7 among the concave portions Wb-7 and the convex top surfaces Wd-7.

As is clear from Examples 4 to 7, it was possible to selectively form films W5 on the convex top surfaces Wd by using various types of processing gases G.

Examples 8 to 12

In Examples 8 to 12, steps S1 to S4 and S6 were performed by using the film forming device 1 illustrated in FIG. 7 under the processing conditions shown in Table 4, and steps S5 and S7 to S8 were not performed. In addition, as described above, before the substrates W were loaded into the processing container 2, concave portions and convex portions were formed in advance on the substrate surfaces Wa.

TABLE 3

| | Convex top surface | Concave bottom surface | Steps | Temperature [degrees C.] | $TiCl_4$ | $H_2$ | Ar | Other supplied gas | RF | Time [sec] | Number of Cycles |
|---|---|---|---|---|---|---|---|---|---|---|---|
| Example 4 | $SiO_2$ | $SiO_2$ | S3 | 130 | ○ | ○ | ○ | — | ON | 120 | 1 |
| | | | S4 | 130 | — | — | ○ | $O_2$ | — | 120 | |
| Example 5 | $SiO_2$ | $SiO_2$ | S3 | 130 | ○ | ○ | ○ | — | ON | 10 | 10 |
| | | | S4 | 130 | — | — | ○ | $O_2$ | — | 60 | |
| Example 6 | $SiO_2$ | $SiO_2$ | S3 | 130 | ○ | ○ | ○ | — | ON | 10 | 10 |
| | | | S4 | 130 | — | — | ○ | $H_2O$ | — | 60 | |
| Example 7 | $SiO_2$ | $SiO_2$ | S3 | 130 | ○ | ○ | ○ | — | ON | 10 | 10 |
| | | | S4 | 130 | — | — | ○ | $N_2$ | ON | 10 | |

TABLE 4

| | Convex top surface | Concave bottom surface | Steps | Temperature [degrees C.] | $TiCl_4$ | $H_2$ | Ar | Other supplied gas | RF | Time [sec] | Number of Cycles |
|---|---|---|---|---|---|---|---|---|---|---|---|
| Example 8 | $TiO_2$ | $TiO_2$ | S3 | 130 | ○ | ○ | ○ | — | ON | 120 | 1 |
| | | | S4 | 130 | — | — | ○ | $O_2$ | — | 120 | |
| Example 9 | SiN | SiN | S3 | 130 | ○ | ○ | ○ | — | ON | 120 | 1 |
| | | | S4 | 130 | — | — | ○ | $O_2$ | — | 120 | |
| Example 10 | Si | Si | S3 | 130 | ○ | ○ | ○ | — | ON | 120 | 1 |
| | | | S4 | 130 | — | — | ○ | $O_2$ | — | 120 | |
| Example 11 | C | C | S3 | 130 | ○ | ○ | ○ | — | ON | 120 | 1 |
| | | | S4 | 130 | — | — | ○ | $O_2$ | — | 120 | |
| Example 12 | Ru | $SiO_2$ | S3 | 130 | ○ | ○ | ○ | — | ON | 120 | 1 |
| | | | S4 | 130 | — | — | ○ | $O_2$ | — | 120 | |

Figure 12A:
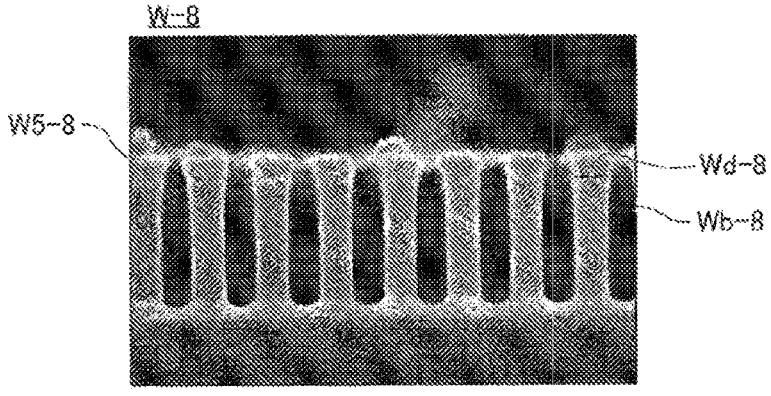
FIG. 12A is a SEM photograph of a substrate according to Example 8 after processing.

FIG. 12A shows a SEM photograph of a substrate W-8 after processing according to Example 8. In Example 8, steps S3 and S4 were performed once each under the same conditions as Example 4, except that the materials of the convex top surfaces and the concave bottom surfaces were changed to titanium oxide ($TiO_2$). As a result, a film W5-8 was selectively formed on the convex top surfaces Wd-8 among the concave portions Wb-8 and the convex top surfaces Wd-8.

Figure 12B:
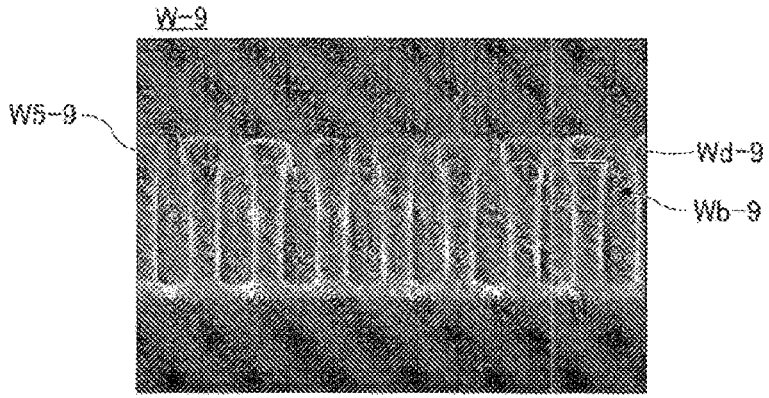
FIG. 12B is a SEM photograph of a substrate according to Example 9 after processing.

FIG. 12B shows a SEM photograph of a substrate W-9 after processing according to Example 9. In Example 9, steps S3 and S4 were performed once each under the same conditions as Example 4, except that the materials of the convex top surfaces and the concave bottom surfaces were changed to silicon nitride (SiN). As a result, a film W5-9 was selectively formed on the convex top surfaces Wd-9 among the concave portions Wb-9 and the convex top surfaces Wd-9.

convex top surfaces were changed to ruthenium (Ru). As a result, a film W5-12 was selectively formed on the convex top surfaces Wd-12 among the concave portions Wb-12 and the convex top surfaces Wd-12.

As is clear from Examples 8 to 12, it was possible to selectively form films W5 on the convex top surfaces Wd by using the substrates W made of various materials.

Examples 13 to 14

In Examples 13 to 14, steps S1 to S4 and S6 were performed by using the film forming device 1 illustrated in FIG. 7 under the processing conditions shown in Table 5, and steps S5 and S7 were not performed. In addition, as described above, before the substrates W were loaded into the processing container 2, concave portions and convex portions were formed in advance on the substrate surfaces Wa.

TABLE 5

| | Convex top surface | Concave bottom surface | Steps | Temperature [degrees C.] | $TiCl_4$ | $H_2$ | Ar | Other supplied gas | RF | Time [sec] | Number of Cycles |
|---|---|---|---|---|---|---|---|---|---|---|---|
| Example 13 | $SiO_2$ | $SiO_2$ | S3 | 80 | ○ | ○ | ○ | — | ON | 120 | 1 |
| | | | S4 | 80 | — | — | ○ | $O_2$ | — | 120 | |
| Example 14 | $SiO_2$ | $SiO_2$ | S3 | 200 | ○ | ○ | ○ | — | ON | 120 | 1 |
| | | | S4 | 200 | — | — | ○ | $O_2$ | — | 120 | |

Figure 12C:
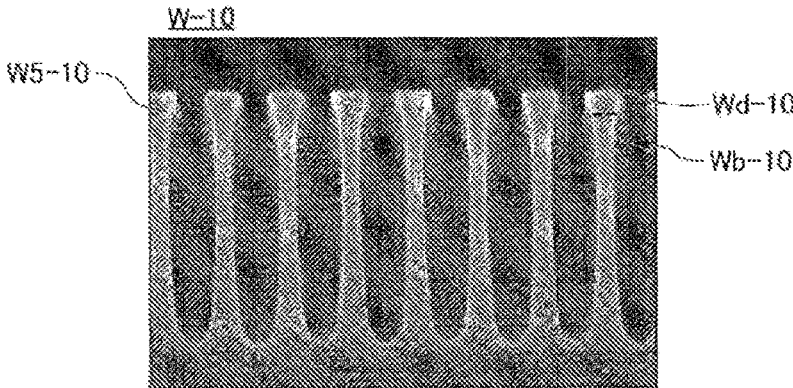
FIG. 12C is a SEM photograph of a substrate according to Example 10 after processing.

FIG. 12C shows a SEM photograph of a substrate W-10 according to Example 10 after processing. In Example 10, steps S3 and S4 were performed once each under the same conditions as Example 4, except that the materials of the convex top surfaces and the concave bottom surfaces were changed to silicon (Si). As a result, a film W5-10 was selectively formed on the convex top surfaces Wd-10 among the concave portions Wb-10 and the convex top surfaces Wd-10.

Figure 13A:
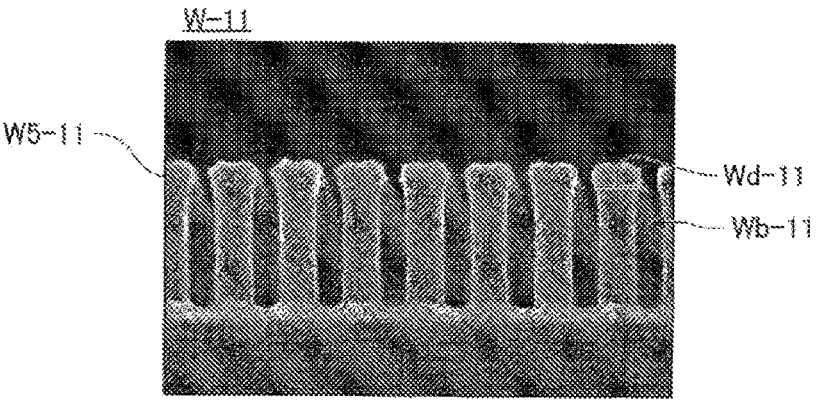
FIG. 13A is a SEM photograph of a substrate according to Example 11 after processing.

FIG. 13A shows a SEM photograph of a substrate W-11 according to Example 11 after processing. In Example 11, steps S3 and S4 were performed once each under the same conditions as Example 4, except that the materials of the convex top surfaces and the concave bottom surfaces were changed to carbon (C). As a result, a film W5-11 was selectively formed on the convex top surfaces Wd-11 among the concave portions Wb-11 and the convex top surfaces Wd-11.

Figure 13B:
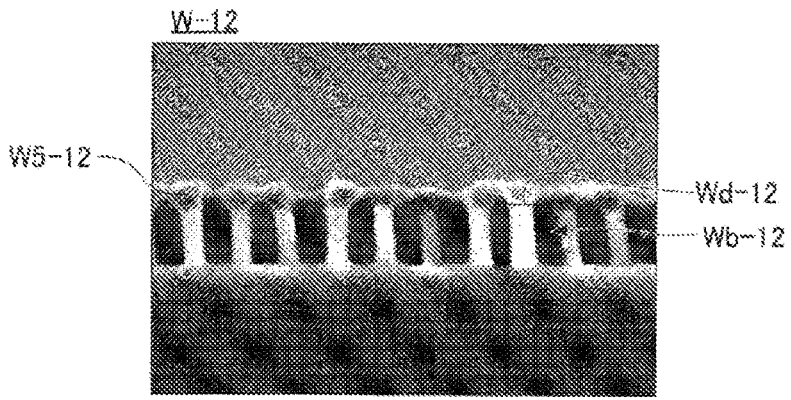
FIG. 13B is a SEM photograph of a substrate according to Example 12 after processing.
Figure 14A:
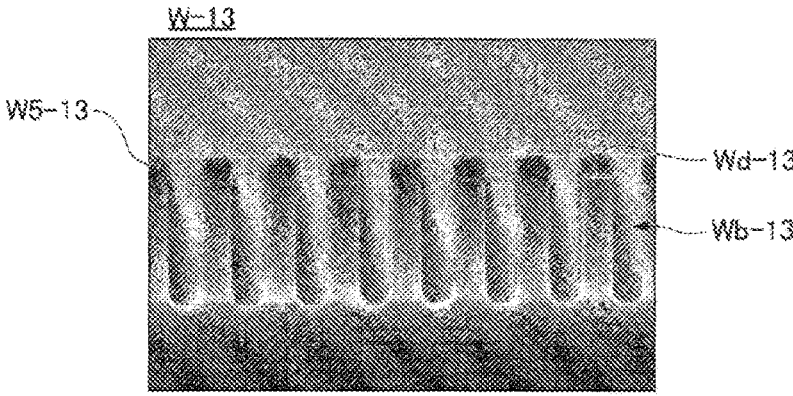
FIG. 14A is a SEM photograph of a substrate according to Example 13 after processing.

FIG. 13B shows a SEM photograph of a substrate W-12 according to Example 12 after processing. In Example 12, steps S3 and S4 were performed once each under the same conditions as Example 4, except that the materials of the FIG. 14A shows a SEM photograph of a substrate W-13 according to Example 13 after processing. In Example 13, steps S3 and S4 were performed once each under the same conditions as Example 4, except that the temperature of the substrate was changed to 80 degrees C. As a result, a film W5-13 was selectively formed on the convex top surfaces Wd-13 among the concave portions Wb-13 and the convex top surfaces Wd-13.

Figure 14B:
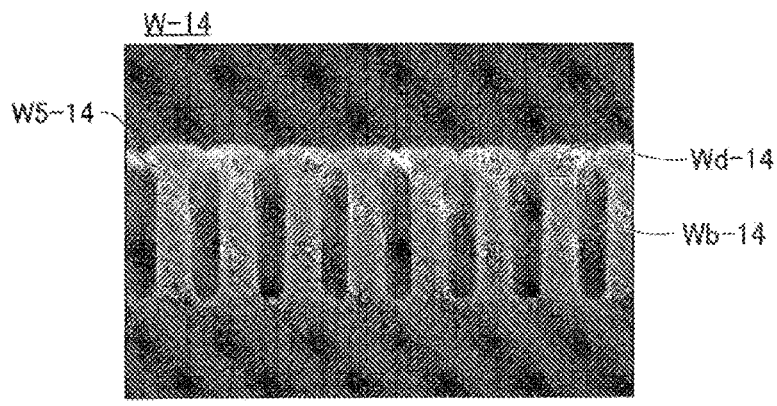
FIG. 14B is a SEM photograph of a substrate according to Example 14 after processing.

FIG. 14B shows a SEM photograph of a substrate W-14 according to Example 14 after processing. In Example 14, steps S3 and S4 were performed once each under the same conditions as Example 4, except that the temperature of the substrate was changed to 200 degrees C. As a result, a film W5-14 was selectively formed on the convex top surfaces Wd-14 among the concave portions Wb-14 and the convex top surfaces Wd-14.

As is clear from Examples 13 and 14, it was possible to selectively form films W5 on the convex top surfaces Wd at various substrate temperatures.

Examples 15 to 16

In Example 15, steps S1 to S4 and S6 were performed by using the film forming device 1 illustrated in FIG. 7 under the processing conditions shown in Table 6, and steps S5 and S7 were not performed. On the other hand, in Example 16, steps S1 to S6 were performed by using the film forming device 1 illustrated in FIG. 7 under the processing conditions shown in Table 6, and step S7 was not performed. In addition, as described above, before the substrates W were loaded into the processing container 2, concave portions and convex portions were formed in advance on the substrate surfaces Wa.

performed twice each. Further, the materials of the convex top surfaces and the concave bottom surfaces were changed to $TiO_2$. As a result, a film W5-17 was selectively formed on the convex top surfaces Wd-17 among the concave portions Wb-17 and the convex top surfaces Wd-17. The same results were obtained when the materials of the convex top surfaces and the concave bottom surfaces were changed to $SiO_2$.

TABLE 6

| Convex top surface | Concave bottom surface | Steps | Temperature [degrees C.] | $TiCl_4$ | $H_2$ | Ar | Other supplied gas | RF | Time [sec] | Number of Cycles |
|---|---|---|---|---|---|---|---|---|---|---|
| Example 15 | $SiO_2$ | $SiO_2$ | S3 | 130 | ○ | ○ | ○ | — | ON | 30 | 12 |
| | | S4 | 130 | — | — | ○ | $O_2$ | — | 60 | |
| Example 16 | $SiO_2$ | $SiO_2$ | S3 | 130 | ○ | ○ | ○ | — | ON | 30 | 12 |
| | | S3 | 130 | — | — | ○ | $O_2$ | — | 60 | |
| | | S5 | 130 | | | ○ | $O_2$ | ON | 60 | |

When the film W5 formed on the convex top surfaces Wd in Example 15 was etched with an aqueous solution having an HF concentration of 0.5% by mass, the etching rate was 762.8 Å/min. On the other hand, when the film W5 formed on the convex top surfaces Wd in Example 16 was etched with an aqueous solution having an HF concentration of 0.5% by mass, the etching rate was 81.3 Å/min. Therefore, it was possible to modify the film W5 by step S5.

Example 18

In Example 18, steps S1 to S4 and S6 were performed by using the film forming device 1 illustrated in FIG. 7 under the processing conditions shown in Table 8, and steps S5 and S7 were not performed. In addition, as described above, before the substrates W were loaded into the processing container 2, concave portions and convex portions were formed in advance on the substrate surfaces Wa.

TABLE 8

| Convex top surface | Concave bottom surface | Steps | Temperature [degrees C.] | $TiCl_4$ | $H_2$ | Ar | Other supplied gas | RF | Time [sec] | Number of Cycles |
|---|---|---|---|---|---|---|---|---|---|---|
| Example 18 | $SiO_2$ | $SiO_2$ | S3 | 90 | ○ | ○ | ○ | — | ON | 60 | 1 |
| | | S4 | 90 | — | — | ○ | $O_2$ | — | 120 | |

Example 17

In Example 17, steps S1 to S4 and S6 were performed by using the film forming device 1 illustrated in FIG. 7 under the processing conditions shown in Table 7, and steps S5 and S7 were not performed. In addition, as described above, before the substrates W were loaded into the processing container 2, concave portions and convex portions were formed in advance on the substrate surfaces Wa.

TABLE 7

| Convex top surface | Concave bottom surface | Steps | Temperature [degrees C.] | $TiCl_4$ | $H_2$ | Ar | Other supplied gas | RF | Time [sec] | Number of Cycles |
|---|---|---|---|---|---|---|---|---|---|---|
| Example 17 | $TiO_2$ | $TiO_2$ | S3 | 130 | ○ | ○ | ○ | — | ON | 60 | 2 |
| | | S4 | 130 | — | — | ○ | $O_2$ | ON | 60 | |

Figure 16:
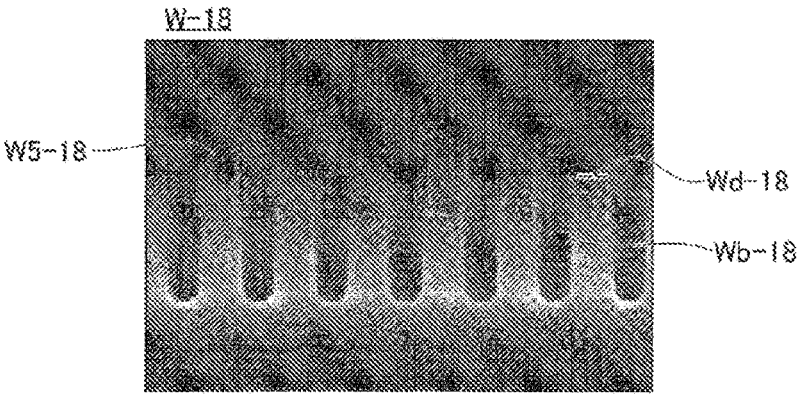
FIG. 16 is a SEM photograph of a substrate according to Example 18 after processing.

FIG. 16 shows a SEM photograph of a substrate W-18 after processing according to Example 18. In Example 18, unlike Example 1, in step S3, $SnCl_4$ was supplied into the processing container 2 instead of $TiCl_4$ as the raw material gas. As a result, a film W5-18 was selectively formed on the convex top surfaces Wd-18 among the concave portions Wb-18 and the convex top surfaces Wd-18.

Figure 15:
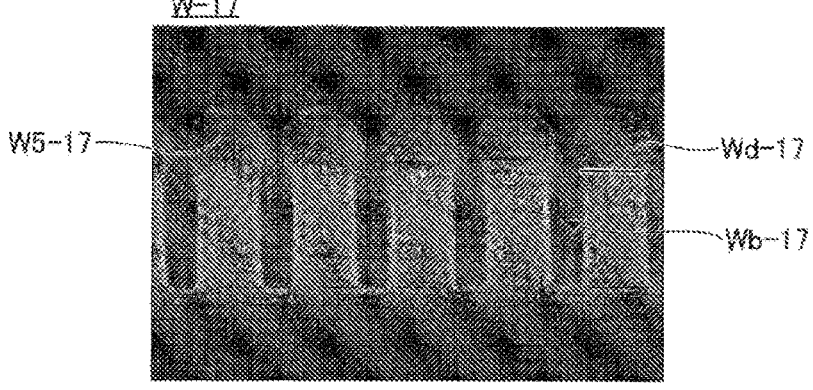
FIG. 15 is a SEM photograph of a substrate according to Example 17 after processing.

FIG. 15 shows a SEM photograph of a substrate W-17 according to Example 17 after processing. In Example 17, unlike Example 1, in step S3, $Si_2Cl_6$ (HCD) was supplied into the processing container 2 instead of $TiCl_4$ as the raw material gas. In addition, in step S4, the Ar gas and the $O_2$ gas were plasmarized. In addition, steps S3 and S4 were As is clear from Examples 17 and 18, it was possible to selectively form films W5 on the convex top surfaces Wd by using various raw material gases.

Regarding the above-described embodiments, the following Supplementary Notes are disclosed.

[Supplementary Note 1]

A film forming method includes:

(A) preparing a substrate with a surface having a first region where a first film is exposed, and a second region where a second film formed by a material different from the first film is exposed;

(B) forming a stepped portion in the surface such that the first region becomes higher than the second region;

(C) supplying a liquid to the surface where the stepped portion is formed; and (D) supplying a processing gas that chemically changes the liquid, to the surface, and moving the liquid from the second region to the first region by a reaction between the processing gas and the liquid to selectively form a film in the first region with respect to the second region.

[Supplementary Note 2]

In the film forming method of Supplementary Note 1 above, the first film is an insulating film, and the second film is a conductive film.

[Supplementary Note 3]

In the film forming method of Supplementary Note 1 or 2 above, (B) includes selectively forming a self-assembled monomolecular film in the second region with respect to the first region, and forming the second insulating film in the first region while inhibiting formation of a second insulating film in the second region by using the self-assembled monomolecular film.

[Supplementary Note 4]

In the film forming method of Supplementary Note 1 or 2 above, (B) includes selectively etching the second region with respect to the first region.

[Supplementary Note 5]

The film forming method of any one of Supplementary Notes 1 to 4 above further includes: etching a portion of the film.

[Supplementary Note 6]

In the film forming method of any one of Supplementary Notes 1 to 5 above, the liquid is a halide.

[Supplementary Note 7]

In the film forming method of Supplementary Note 6 above, (C) includes forming the liquid by a reaction between a raw material gas that is a raw material for the halide and a reaction gas that reacts with the raw material gas.

[Supplementary Note 8]

In the film forming method of any one of Supplementary Notes 1 to 5 above, the liquid is a liquid polymer.

[Supplementary Note 9]

In the film forming method of Supplementary Note 8 above, the liquid is synthesized in a processing container that accommodates the substrate, and is supplied to the surface of the substrate.

[Supplementary Note 10]

In the film forming method of any one of Supplementary Notes 1 to 9 above, the processing gas that chemically changes the liquid in (D) includes an element that is incorporated into the liquid.

[Supplementary Note 11]

In the film forming method of Supplementary Note 10 above, the processing gas that chemically changes the liquid includes an oxygen-containing gas.

[Supplementary Note 12]

In the film forming method of Supplementary Note 10 above, the processing gas that chemically changes the liquid includes a nitrogen-containing gas.

[Supplementary Note 13]

In the film forming method of Supplementary Note 10 above, the processing gas that chemically changes the liquid includes a hydride gas.

[Supplementary Note 14]

In the film forming method of any one of Supplementary Notes 1 to 9 above, the processing gas that chemically changes the liquid degasses an element constituting the liquid.

[Supplementary Note 15]

In the film forming method of Supplementary Note 14 above, the processing gas that chemically changes the liquid includes a reducing gas.

[Supplementary Note 16]

In the film forming method of Supplementary Note 15 above, the reducing gas is a hydrogen gas or a deuterium gas.

[Supplementary Note 17]

In the film forming method of any one of Supplementary Note 16 above, (D) includes plasmarizing the processing gas that chemically changes the liquid.

[Supplementary Note 18]

The film forming method of any one of Supplementary Notes 1 to 17 above further includes modifying the film.

Although the embodiments of the film forming method and the film forming device according to the present disclosure have been described above, the present disclosure is not limited to the above-described embodiments or the like. Various changes, modifications, substitutions, additions, deletions, and combinations may be made within the scope of the claims. Of course, these also fall within the technical scope of the present disclosure.

This application claims priority based on Japanese Patent Application No. 2021-093208 filed with the Japan Patent Office on Jun. 2, 2021, and the disclosure of Japanese Patent Application No. 2021-093208 is incorporated herein in its entirety by reference.

EXPLANATION OF REFERENCE NUMERALS

A1: first region, A2: second region, L: liquid, W: substrate, W1: first film, W2: second film, W5: film (third insulating film)

What is claimed is:

1. A film forming method comprising:

(A) preparing a substrate with a surface having a first region where a first film is exposed, and a second region where a second film formed by a material different from the first film is exposed;

(B) forming a stepped portion in the surface such that the first region becomes higher than the second region;

(C) supplying a liquid to the surface where the stepped portion is formed; and (D) supplying, to the surface, a processing gas that chemically changes the liquid, and moving the liquid from the second region to the first region by a reaction between the processing gas and the liquid to selectively form a film in the first region with respect to the second region, wherein the liquid is a halide.

2. The film forming method of claim 1, wherein the first film is an insulating film, and the second film is a conductive film.

3. The film forming method of claim 1, wherein (B) includes selectively forming a self-assembled monomolecular film in the second region with respect to the first region, and forming a second insulating film in the first region while inhibiting formation of the second insulating film in the second region by using the self-assembled monomolecular film.

4. The film forming method of claim 1, wherein (B) includes selectively etching the second region with respect to the first region.

5. The film forming method of claim 1, further comprising:

etching a portion of the film which is selectively formed in (D).

6. The film forming method of claim 1, wherein (C) includes forming the liquid by a reaction between a raw material gas which is a raw material for the halide and a reaction gas which reacts with the raw material gas.

7. The film forming method of claim 1, wherein the processing gas that chemically changes the liquid in (D) includes an element that is incorporated into the liquid.

8. The film forming method of claim 7, wherein the processing gas that chemically changes the liquid includes an oxygen-containing gas.

9. The film forming method of claim 7, wherein the processing gas that chemically changes the liquid includes a nitrogen-containing gas.

10. The film forming method of claim 7, wherein the processing gas that chemically changes the liquid includes a hydride gas.

11. The film forming method of claim 1, wherein (D) includes plasmarizing the processing gas that chemically changes the liquid.

12. The film forming method of claim 1, further comprising:

modifying the film which is selectively formed in (D).

13. A film forming method comprising:

(A) preparing a substrate with a surface having a first region where a first film is exposed, and a second region where a second film formed by a material different from the first film is exposed;

(B) forming a stepped portion in the surface such that the first region becomes higher than the second region;

(C) supplying a liquid to the surface where the stepped portion is formed; and (D) supplying, to the surface, a processing gas that chemically changes the liquid, and moving the liquid from the second region to the first region by a reaction between the processing gas and the liquid to selectively form a film in the first region with respect to the second region, wherein the processing gas that chemically changes the liquid degasses an element constituting the liquid.

14. The film forming method of claim 13, wherein the processing gas that chemically changes the liquid includes a reducing gas.

15. The film forming method of claim 14, wherein the reducing gas is a hydrogen gas or a deuterium gas.

16. A film forming device comprising:

a transferrer configured to transfer a substrate with a surface having a first region where a first film is exposed and a second region where a second film formed of a material different from the first film is exposed;

a processing container into and from which the substrate is loaded and unloaded by the transferrer;

a holder configured to hold the substrate horizontally within the processing container in a state where the surface of the substrate is oriented upward;

a gas supplier configured to supply, to the surface of the substrate held by the holder, a gas that forms a stepped portion in the surface, a raw material gas supplied to the surface in which the stepped portion is formed, a reaction gas that reacts with the raw material gas, and a processing gas that chemically changes a liquid formed by the reaction between the raw material gas and the reaction gas; and a controller configured to control the transferrer and the gas supplier, wherein the controller is configured to execute:

(A) loading the substrate into the processing container;

(B) forming the stepped portion in the surface such that the first region becomes higher than the second region;

(C) supplying the liquid formed by the reaction between the raw material gas and the reaction gas to the surface where the stepped portion is formed; and (D) supplying a processing gas to the surface, and moving the liquid from the second region to the first region by a reaction between the processing gas and the liquid to selectively form a film in the first region with respect to the second region.

\* \* \* \* \*